(12) United States Patent
Park et al.

(10) Patent No.: US 11,829,063 B2
(45) Date of Patent: Nov. 28, 2023

(54) REFLECTIVE PHOTOMASK AND METHOD FOR FABRICATING THE SAME

(71) Applicant: SAMSUNG ELECTRONICS CO., LTD., Suwon-si (KR)

(72) Inventors: Sang Uk Park, Yongin-si (KR); Jong Ju Park, Hwaseong-si (KR); Jong Keun Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 17/501,085

(22) Filed: Oct. 14, 2021

(65) Prior Publication Data
US 2022/0283489 A1 Sep. 8, 2022

(30) Foreign Application Priority Data

Mar. 2, 2021 (KR) .......................... 10-2021-0027211

(51) Int. Cl.
*G03F 1/24* (2012.01)
(52) U.S. Cl.
CPC ....................................... *G03F 1/24* (2013.01)
(58) Field of Classification Search
CPC ........................................................ G03F 1/24
USPC ............................................................. 430/5
See application file for complete search history.

(56) References Cited

U.S. PATENT DOCUMENTS

| | | |
|---|---|---|
| 8,592,103 B2 | 11/2013 | Mangat et al. |
| 9,170,480 B2 | 10/2015 | Lee |
| 9,448,468 B2 | 9/2016 | Tanabe et al. |
| 10,095,101 B2 | 10/2018 | Oshemkov et al. |
| 10,719,008 B2 | 7/2020 | Seo |
| 11,506,968 B2 * | 11/2022 | Han .......................... G03F 1/50 |
| 2019/0196322 A1 | 6/2019 | Lin et al. |
| 2019/0368484 A1 | 12/2019 | Te et al. |
| 2021/0240069 A1 * | 8/2021 | Lin ............................ G03F 1/22 |
| 2021/0397076 A1 * | 12/2021 | Kim .......................... G03F 1/22 |

* cited by examiner

*Primary Examiner* — Christopher G Young
(74) *Attorney, Agent, or Firm* — F. CHAU & ASSOCIATES, LLC

(57) ABSTRACT

A reflective photomask includes a pattern area, a non-pattern area at least partially surrounding the pattern area, and a black border area interposed between the pattern area and the non-pattern area. The reflective photomask includes a mask substrate, a reflector layer stacked on the mask substrate, and an absorber layer stacked on the reflector layer. The black border area includes a plurality of first anneal patterns which are arranged along an edge of the pattern area and each have an island shape, and a second anneal pattern which fills inside of the black border area and has a line shape.

20 Claims, 25 Drawing Sheets under 35 U.S.C., § to
REFLECTIVE PHOTOMASK AND METHOD FOR FABRICATING THE SAME This application claims priority under 35 U.S.C., § to Korean Patent Application No. 10-2021-0027211, filed on Mar. 2, 2021 the disclosure of which is herein incorporated by reference in its entirety.

TECHNICAL FIELD

The present disclosure relates to a photomask and, more specifically, to a reflective photomask and a method far fabricating the same.

DISCUSSION OF THE RELATED ART

As geometric constraints such as design rules of semiconductor devices are gradually reduced, integrated circuit patterns are becoming smaller in size. To satisfy such technical requirements, an extreme ultraviolet lithography process which utilizes an extreme ultraviolet (EUV) having a short wavelength as an optical source may be used. In particular, in the mass production process of nano-class semiconductor devices of 40 nm or less, extreme ultraviolet rays having a wavelength of about 10 nm to about 14 nm may be used.

Since extreme ultraviolet rays are absorbed by most refractive optical materials, a reflective optical system rather than a refractive optical system is used in the extreme ultraviolet lithography process. A reflective photomask used in the reflective optical system may include a mask substrate, a reflector layer stacked on the mask substrate, and an absorber layer stacked on the reflector layer. The absorber layer may transfer a pattern image by selectively absorbing the extreme ultraviolet rays in the pattern area of the reflective photomask.

Further, an edge area of the reflective photomask may be a non-pattern area in which a pattern image is not formed. However, the extreme ultraviolet rays reflected from the edge area of the reflective photomask may penetrate the pattern area to adversely affect the pattern image transfer. To prevent this, a black border area with reduced reflectance may be formed along the edges of the pattern area.

SUMMARY

A reflective photomask includes a pattern area, a non-pattern area surrounding the pattern area, and a black border area interposed between the pattern area and the non-pattern area. The reflective photomask includes a mask substrate, a reflector layer stacked on the mask substrate, and an absorber layer stacked on the reflector layer. The black border area includes a plurality of first anneal patterns which are arranged along an edge of the pattern area and each have an island shape, and a second anneal pattern which fills an inside of the black border area and has a line shape.

A reflective photomask includes a pattern area, and a black border area surrounding the pattern area. The reflective photomask includes a mask substrate, a reflector layer stacked on the mask substrate, and an absorber layer stacked on the reflector layer. The black border areas includes first and second anneal areas which are arranged along an edge of the pattern area and each have an island shape, a first stitching area in which the first and second anneal areas overlap, and a third anneal area which is separated from the pattern area. The first and second anneal areas are interposed between the third anneal area and the pattern area and has a line shape. A thickness of the reflector layer of the black border area is smaller than a thickness of the reflector layer of the pattern area.

A method for fabricating a reflective photomask includes a pattern area and a black border area surrounding the pattern area. A reflector layer and an absorber layer are sequentially formed on a mask substrate. A first annealing process is performed at an edge of the black border area, using a step manner. A second annealing process is performed on an inside of the black border area, using a scan manner.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a reflective photomask according to exemplary embodiments of the present disclosure will be described referring to FIGS. 1 to 18.

Figure 1:
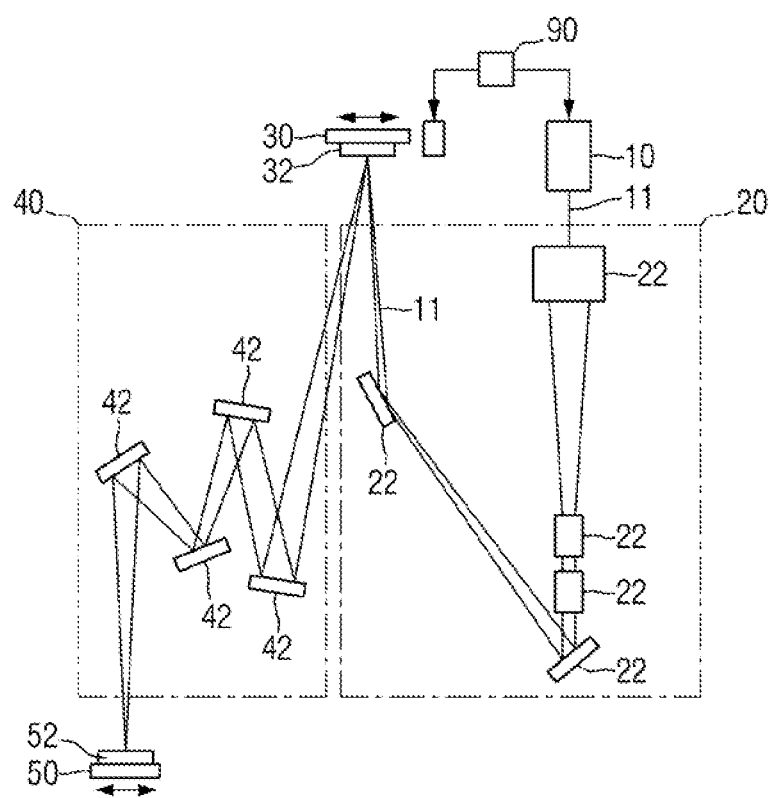
FIG. 1 is a conceptual diagram illustrating an extreme ultraviolet lithography device that uses a reflective photomask according to some embodiments of the present disclosure.

FIG. 1 is a conceptual diagram illustrating an extreme ultraviolet lithography device that uses a reflective photomask according to some embodiments of the present disclosure.

Referring to FIG. 1, the extreme ultraviolet lithography device according to some embodiments of the present disclosure may include an optical source unit 10, a condenser unit 20, a projection unit 40, and a control unit 90.

The optical source unit 10 may generate light 11. In some embodiments of the present disclosure, the light 11 may include extreme ultraviolet (EUV) light. For example, the optical source unit 10 may generate extreme ultraviolet rays having a wavelength of about 13.5 nm, using the plasma generated by irradiating tin (Sn) with a $CO_2$ laser. The light 11 generated from the optical source unit 10 may be provided to the condenser unit 20.

The condenser unit 20 may guide the light 11 (for example, extreme ultraviolet rays) generated in the optical source unit 10 toward the photomask 32. The photomask 32 may correspond to reflective photomasks to be described later, according to some embodiments of the present disclosure. The condenser unit 20 may include condensing optics 22 (e.g., lenses and/or mirrors). The condensing optics 22 may collect and reflect the light 11 and guide it toward the photomask 32. The light 11 may be obliquely incident on the photomask 32 through the condenser unit 20.

In some embodiments of the present disclosure, the photomask 32 may be mounted on the mask stage 30 and moved. The optical source unit 10 and the mask stage 30 may be controlled by the control unit 90. The controller unit 90 may be a motion control circuit that electronically controls the mask stage 30 to move in a desired direction.

The light 11 incident on the photomask 32 is reflected by the photomask 32 and may be incident on the projection unit 40. The projection unit 40 may project the pattern image of the photomask 32 onto a target substrate 52. The target substrate 52 may be a wafer on which an integrated circuit is formed. For example, the target substrate 52 may include a photoresist film that reacts with the light 11. The projection unit 40 may include projection optics 42 (e.g., lenses and/or mirrors). The projection optics 42 may reduce the pattern image on the photomask 32 at a predetermined demagnification (e.g., 4 times, 6 times, or 8 times) using the light 11 reflected by the photomask 32, and may project the pattern image onto the target substrate 52.

In some embodiments of the present disclosure, the target substrate 52 may be mounted on the substrate stage 50. The substrate stage 50 may move the target substrate 52 to change an exposure area an exposure position) of the target substrate 52.

Figure 2:
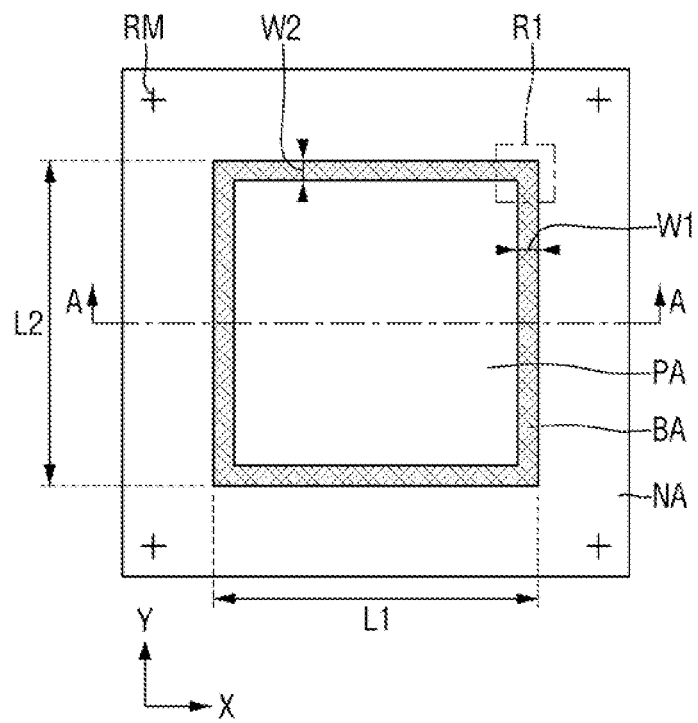
FIG. 2 is a schematic plan view illustrating a reflective photomask according to some embodiments of the present disclosure.
Figure 3:
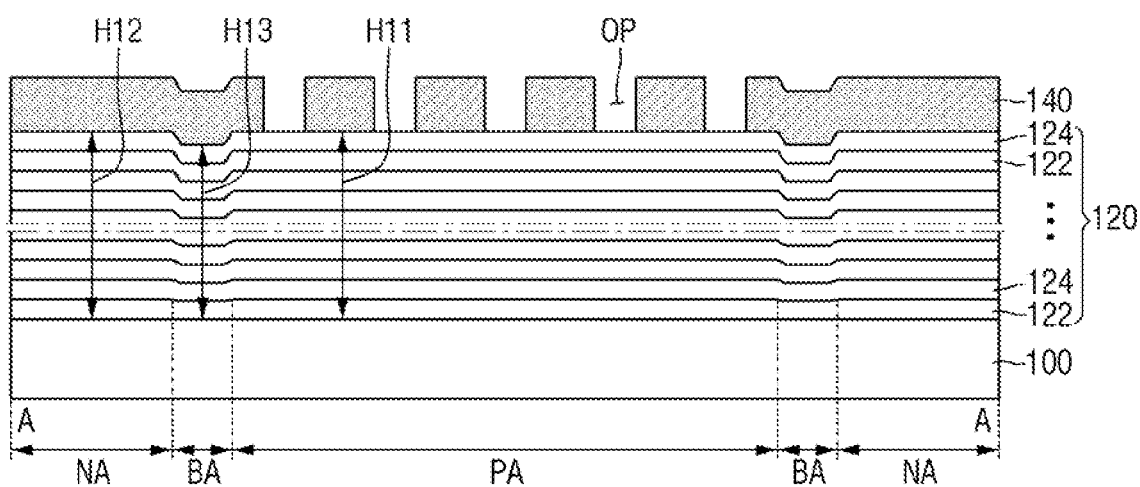
FIG. 3 is a schematic cross-sectional view taken along A-A of FIG. 2.
Figure 4:
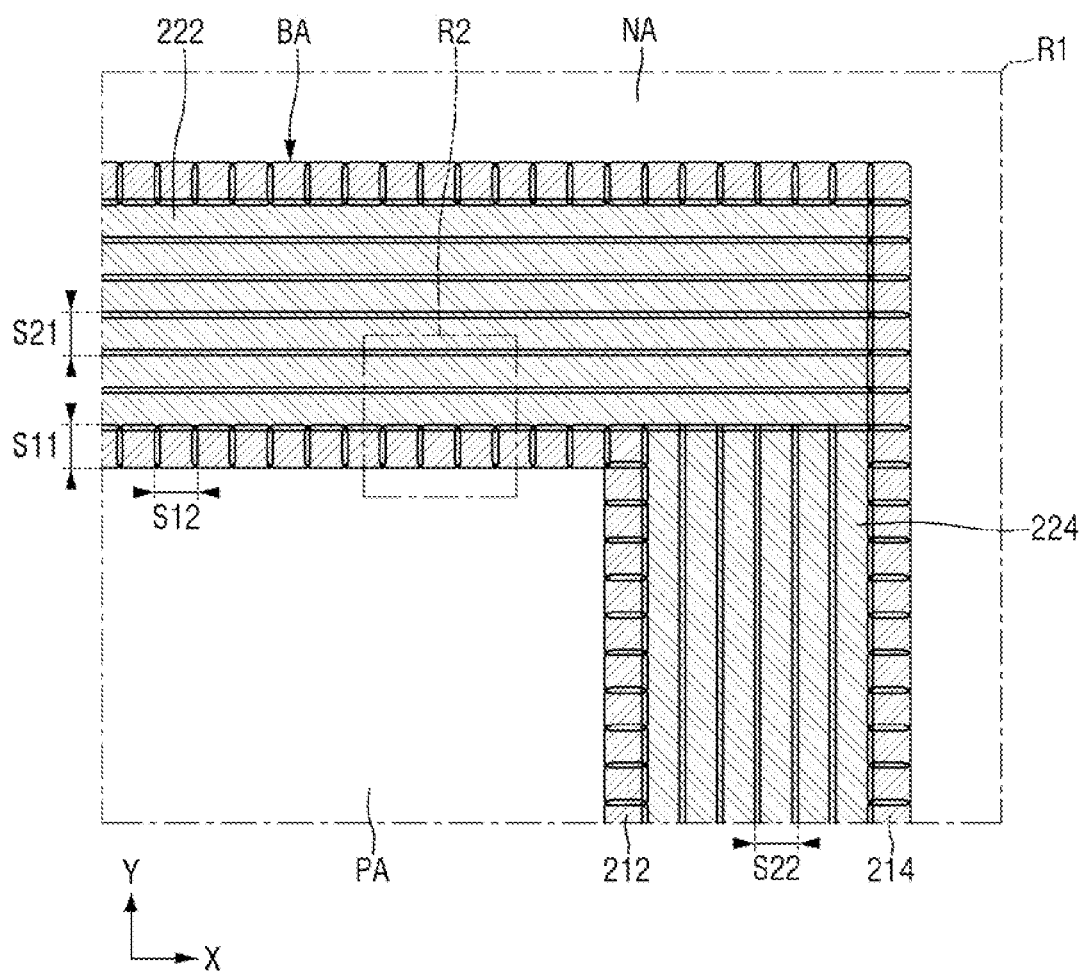
FIG. 4 is an enlarged view illustrating a R1 area of FIG. 3.
Figure 5:
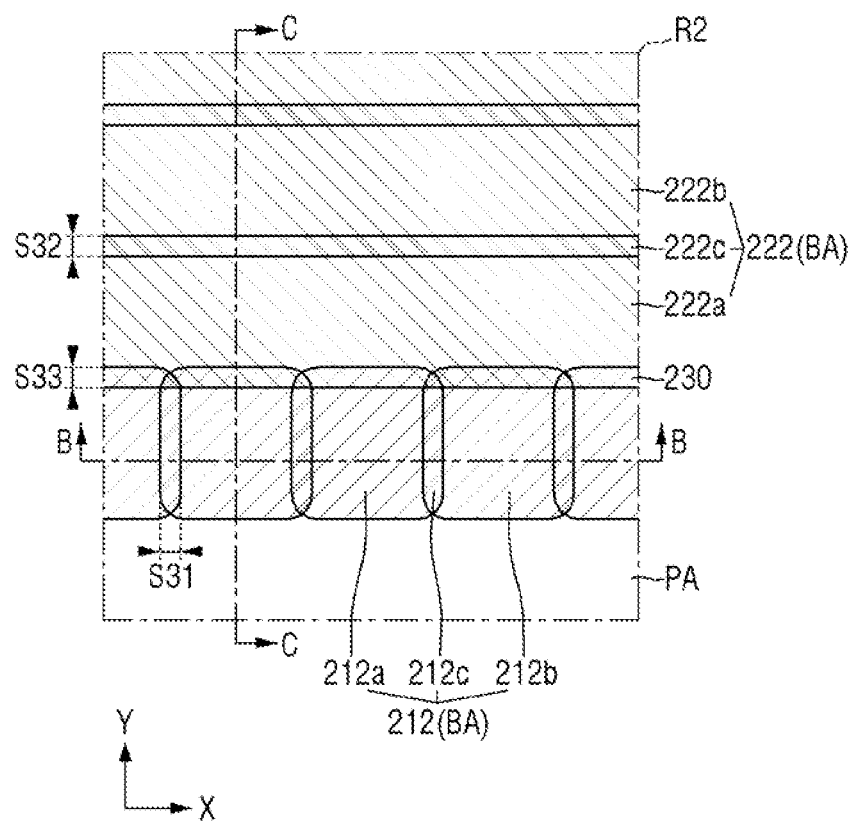
FIG. 5 is an enlarged view illustrating a R2 area of FIG. 4.
Figure 6:
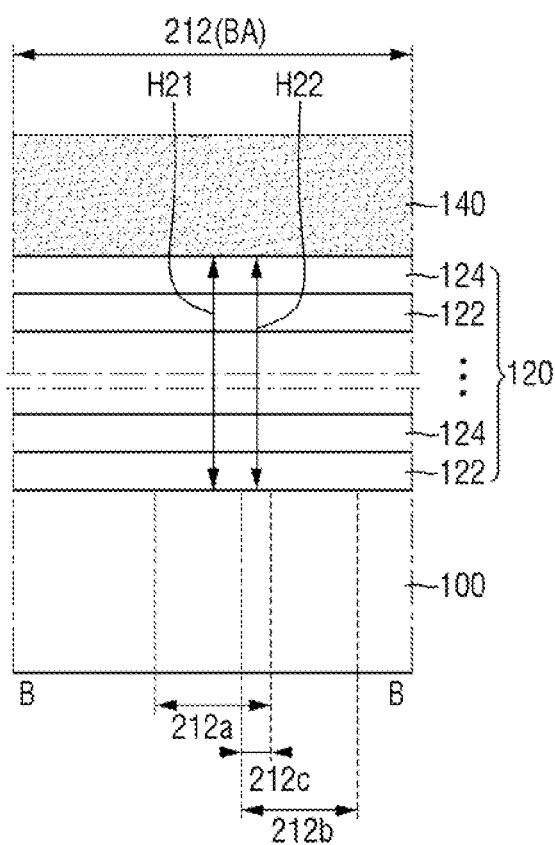
FIG. 6 is a schematic cross-sectional view taken along B-B of FIG. 5.
Figure 7:
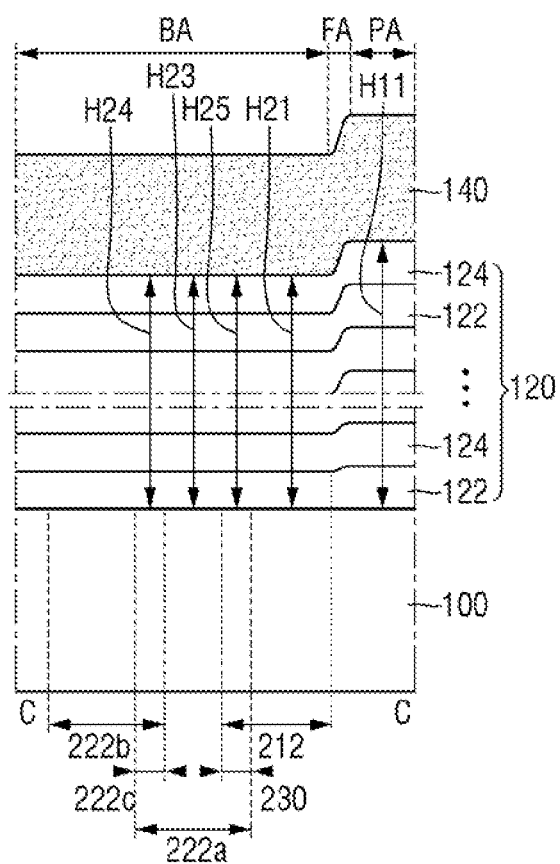
FIG. 7 is a schematic cross-sectional view taken along C-C of FIG. 5.
Figure 8:
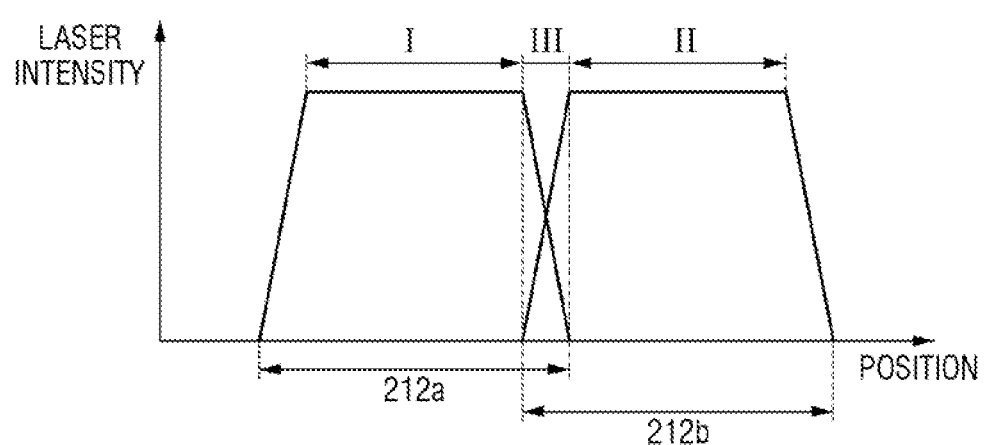
FIG. 8 is a graph illustrating stitching areas of FIGS. 6 and 7.

FIG. 2 is a schematic plan view illustrating a reflective photomask according to some embodiments of the present disclosure. FIG. 3 is a schematic cross-sectional view taken along A-A of FIG. 2. FIG. 4 is an enlarged view illustrating a R1 area of FIG. 3. FIG. 5 is an enlarged view illustrating a R2 area of FIG. 4. FIG. 6 is a schematic cross-sectional view taken along B-B of FIG. 5. FIG. 7 is a schematic cross-sectional view taken along C-C of FIG. 5. FIG. 8 is a graph illustrating stitching areas of FIGS. 6 and 7.

Referring to FIG. 2, the reflective photomask according to some embodiments of the present disclosure may include a pattern area PA, a non-pattern area NA, and a black border area BA.

The non-pattern area NA may at least partially surround the pattern area PA. The black border area BA may be interposed between the pattern area PA and the non-pattern area NA. As an example, the pattern area PA may be rectangular, and each of the black border area BA and the non-pattern area NA may surround the pattern area PA in the form of a frame. For example, each of the non-pattern area NA and the black border area BA may have a shape of a rectangular frame.

The pattern area PA may be an area for transferring the pattern image onto the target substrate (e.g., 50 of FIG. 1), and the non-pattern area NA may be an area onto which the pattern image is not transferred. The black border area BA may be an area in which reflectance is adjusted to prevent the extreme ultraviolet rays reflected from the outside adjacent to the pattern area PA from causing an overlap exposure with the extreme ultraviolet rays reflected from the pattern area PA. This will be described more specifically in the description of FIGS. 3 to 8.

A length L1 of the black border area BA extending in a first direction X and a length L2 of the black border area BA extending in a second direction Y may be, for example, about 50 mm to about 200 mm, respectively. Although the lengths L1 and L2 of the black border area BA extending in the first direction X and the second direction Y are shown as being the same as each other, this is only an example, and the lengths may, of course, be different from each other. Preferably, the length L1 of the black border area BA extending in the first direction X may be about 70 mm to about 110 mm, and the length L2 of the black border area BA extending in the second direction Y may be about 100 mm to about 140 mm.

A width W1 of the black border area BA in the first direction X and a width W2 of the black border area BA in the second direction Y may be, for example, about 1 mm to about 10 mm, respectively. Although the widths W1 and W2 of the black border area BA in the first direction X and the second direction Y are shown as being the same as each other, this is only an example, and the widths may, of course, differ from each other. Preferably, the width W1 of the black border area BA in the first direction X may be about 0.1 mm to about 4 mm, and the width W2 of the black border area BA in the second direction Y may be about 0.1 mm to about 4 mm.

In some embodiments of the present disclosure, the non-pattern area NA may include a reference mark RM. The reference mark RM may be used as a reference point for identifying a position at which a processing process (for example, a laser annealing treatment to be described later) on the reflective photomask according to some embodiments of the present disclosure is performed. The position, shape, number, and the like of the reference mark RM are not necessarily limited to those shown in the drawing, and may of course be various.

Referring to FIGS. 2 and 3, the reflective photomask, according to some embodiments of the present disclosure, may include a mask substrate 100, a reflector layer 120 and an absorber layer 140. The reflector layer 120 may be a layer that is reflective of light while the absorber layer 140 may be a layer that absorbs light.

The mask substrate 100 may include a low thermal expansion material (LTEM). Further, the mask substrate 110 may include a material having excellent smoothness, flatness, and resistance to a cleaning liquid. For example, the mask substrate 110 may include, but is not necessarily limited to including, synthetic quartz glass, quartz glass, alumina silicate glass, sodalime glass, and or $SiO_2$—$TiO_2$-based glass.

The reflector layer 120 may be stacked on the mask substrate 100. The reflector layer 120 may be configured to reflect light (e.g., 11 of FIG. 1) which is incident on the reflective photomask according to some embodiments of the present disclosure.

In some embodiments of the present disclosure, the reflector layer 120 may include a low-refractive index layer 122 and a high-refractive index layer 124 that are alternately stacked on the mask substrate 100. The high-refractive index layer 124 may have a higher refractive index than that of the low-refractive index layer 122 with respect to extreme ultraviolet light. Although the number of times of alternately stacking of the low-refractive index layer 122 and the high-refractive index layer 124 may be about 20 to about 80, the number of times is not necessarily limited thereto. In some embodiments of the present disclosure, an uppermost layer of the reflector layer 120 may be the high-refractive index layer 124.

The respective materials and thicknesses of the low-refractive index layer 122 and the high-refractive index layer 124 may be appropriately selected, depending on the wavelength of light (e.g., extreme ultraviolet rays) which is incident on the reflector layer 120 and/or the reflectance of light (e.g., extreme ultraviolet rays) required in the reflector layer 120. As an example, the low-refractive index layer 122 may include molybdenum (Mo), and the high-refractive index layer 124 may include silicon (Si). As an example, the thickness of the low-refractive index layer 122 and the high-refractive index layer 124 may be about 2 nm to about 5 nm, respectively.

The reflector layer 120 of the black border area BA may have reduced reflectance. For example, the reflectance of the black border area BA to the extreme ultraviolet rays may be about 1% or less. As an example, the reflectance of the black border area BA to the extreme ultraviolet having a wavelength of about 13.5 nm may be about 0.1% or less. Accordingly, it is possible to prevent the extreme ultraviolet rays reflected from the black border area BA from causing an overlap exposure with the extreme ultraviolet rays reflected from the pattern area.

In some embodiments of the present disclosure, the reflector layer 120 of the black border area BA may be beat-treated. For example, the reflector layer 120 of the black border area BA may be irradiated with an energy beam. The energy beam may include, but is not necessarily limited to including, at least one of an electron beam, a focused ion beam, a laser beam and an electromagnetic beam. Preferably, the reflector layer 120 of the black border area BA, may be subjected to laser-annealing, using a laser.

The reflector layer 120 of the heat-treated black border area BA may have an increased density (or a reduced volume). As an example, when the reflector layer 120 includes amorphous silicon (a-Si), the silicon layer of the black border area BA may be crystallized due to the energy beam (e.g., laser beam), the silicon layer may react with the surrounding metallic material to form metal silicide, or the silicon layer may be diffused into surrounding other material layers to reduce the reflector layer 120 of the black border area BA. Accordingly, the periodic characteristics of the reflector layer 120 of the black border area BA may be changed to reduce the reflectance.

For example, as shown in FIG. 3, a height H13 of the uppermost surface of the reflector layer 120 of the black border area BA may be smaller than a height H11 of the uppermost surface of the reflector layer 120 of the pattern area PA and a height H12 of the uppermost surface of the reflector layer 120 of the non-pattern area NA, on the basis of the upper surface of the mask substrate 100. As an example, the thickness (e.g., H11) of the reflector layer 120 of the pattern area PA and the thickness (e.g., H12) of the reflector layer 120 of the non-pattern area NA may be about 270 nm to about 290 nm, respectively, and the thickness (e.g., H13) of the reflector layer 120 of the black border area BA may be about 220 nm to about 260 nm.

In some embodiments of the present disclosure, the thickness of each of the low-refractive index layer 122 and the high-refractive index layer 124 which form the reflector layer 120 may have a reduced thickness in the black border area BA.

The absorber layer 140 may be stacked on the reflector layer 120. The absorber layer 140 may be configured to absorb at least a part of the light (e.g., 11 of FIG. 1) which is incident on the reflective photomask according to some embodiments of the present disclosure. For example, the reflectance of the absorber layer 140 to the extreme ultraviolet rays may be about 20% or less. As an example, the reflectance of the absorber layer 140 to the extreme ultraviolet rays having a wavelength of about 13.5 nm may be about 2% to about 3%.

The absorber layer 140 may include an opening OP that exposes at least a part of the reflector layer 120 of the pattern area PA. Light (e.g., 11 of FIG. 1) incident on the reflective photomask, according to some embodiments of the present disclosure, may pass through the opening OP and be reflected from the reflector layer 120. Therefore, the absorber layer 140 may transfer a pattern image by selectively absorbing the extreme ultraviolet rays. For example, the pattern image corresponding to the opening OP of the absorber layer 140 may be projected onto the target pattern (e.g., 50 of FIG. 1).

The absorber layer 140 may include, but is not necessarily limited to including, for example, at least one of TaN, TaHf, TaHfN, TaBSi, TaBSiN, TaB, TaBN, TaSi, TaSiN, TaGe, TaGeN, TaZr and TaZrN.

A capping layer may be formed between the reflector layer 120 and the absorber layer 140. The capping layer may be formed, for example, to cover the upper surface of the high-refractive index layer 124 placed on the uppermost layer of the reflector layer 120. The capping layer may prevent damage to the reflector layer 120 and surface oxidation of the reflector layer 120. The capping layer may include, but is not necessarily limited to including, for example, ruthenium (Ru). As shown, the capping layer may be omitted.

Referring to FIGS. 2 to 8, in the reflective photomask, according to some embodiments of the present disclosure, the black border area BA may include first anneal patterns 212 and 214 of an island shape, and second anneal patterns 222 and 224 of a line shape.

A plurality of first anneal patterns 212 and 214 each of an island shape may be arranged along the edges of the black border area BA. For example, some parts of the first anneal patterns 212 and 214 may be arranged along the side surface of the pattern area PA extending in the first direction X, and other parts of the first anneal patterns 212 and 214 may be arranged along the side surface of the pattern area PA extending in the second direction Y. Accordingly, the plurality of first anneal patterns 212 and 214 may be arranged along the edges of the black border area BA which has a frame shape. Here, the first direction X is a direction parallel to the upper surface of the mask substrate 100, and the second direction Y is a direction that is parallel to the upper surface of the mask substrate 100 and intersects the first direction X.

In some embodiments of the present disclosure, the first anneal patterns 212 and 214 may be formed by heat treatment according to a step manner. For example, a stepper device may be used to perform a laser annealing process on the edges of the black border area BA. Accordingly, a plurality of first anneal patterns 212 and 214, each of which has an island shape, may be formed along the edges of the black border area BA.

Although each of the first anneal patterns 212 and 214 are shown as a quadrangle with rounded corners, this is only an example. For example, each of the first anneal patterns 212 and 214 may have a circular shape or any other shape.

In some embodiments of the present disclosure, the plurality of first anneal patterns 212 and 214 may include a plurality of first island patterns 212 arranged along an inner edge of the black border area BA (i.e., an edge of the black border area BA adjacent to the pattern area PA), and a plurality of second island patterns 214 arranged along an outer edge of the black border area BA (i.e., an edge of the black border area BA adjacent to the non-pattern area NA). Since the second island patterns 214 may form a frame shape that is larger than the first island pattern 212, the number of the second island patterns 214 may be greater than the number of the first island patterns 212.

A width S11 of each of the first anneal patterns 212 and 214 in the second direction Y and a width S12 of each of the first anneal patterns 212 and 214 in the first direction X may be, for example, about 1 μm to about 1000 μm, respectively. Preferably, the widths S11 and S12 of each of the first anneal patterns 212 and 214 may be about 100 μm to about 500 μm. More preferably, the widths S11 and S12 of each of the first anneal patterns 212 and 214 may be about 180 μm to about 220 μm. Although the width S11 of the first anneal patterns 212 and 214 in the second direction Y and the width S12 of the first anneal patterns 212 and 214 in the first direction X are shown as being the same as each other, this is only an example, and the widths may, of course, differ from each other.

Although the sizes of each of the first anneal patterns 212 and 214 are shown as being the same as each other, the embodiment is not necessarily limited thereto. For example, some of the first anneal patterns 212 and 214 may, of course, have the size different from some others of the first anneal patterns 212 and 214.

In some embodiments of the present disclosure, the plurality of first anneal patterns 212 and 214 may overlap together to form a first stitching area 212c. For example, as shown in FIG. 5, the first island patterns 212 may include a first anneal area 212a and a second anneal area 212b which are arranged along the first direction X and adjacent to each other. A part of the first anneal area 212a and a part of the second anneal area 212b may overlap to form a fast stitching area 212c extending in the second direction Y. A plurality of first island patterns 212 may be continuously arranged without disconnection through the first stitching area 212c.

In some embodiments of the present disclosure, the thickness of the reflector layer 120 of the first stitching area 212c may be adjusted in the same manner as the thickness of the reflector layer 120 of the other black border area BA. For example, as shown in FIG. 6, a height H22 of the uppermost surface of the reflector layer 120 of the first stitching area 2120 may be the same as the height H21 of the uppermost surface of the reflector layer 120 of the first and second anneal areas 212a and 212b other than the first stitching area 212c, on the basis of the upper surface of the mask substrate 100. However, in the present specification, the term "same" means not only exactly the same thing but also includes minute differences that may occur due to process margins and the like.

This may be due to the intensity of the heat treatment in the first stitching area 212c. For example, as shown in FIG. 8, top-hat type laser beam may be applied to each of the first and second anneal areas 212a and 212b. The intensity of the laser may have inclined profiles at the boundaries of the respective first and second anneal areas 212a and 212b. Accordingly, the intensity of the laser applied to the first stitching area 212c may vary, depending on the degree to which the first and second anneal areas 212a and 212b overlap.

As an example, the first anneal area 212a other than the first stitching area 212c may be defined as a first area I, the second anneal area 212b other than the first stitching area 212c may be defined as a second area II, and the first stitching area 212c between the first area I and the second area II may be defined as a third area III. At this tune, as shown in FIG. 8, the intensity of the laser applied to the third area III may be adjusted in the same manner as the intensity of the laser applied to the first area I and the second area II. In such a case, the thickness (e.g., H22) of the reflector layer 120 of the first stitching area 212c may be formed in the same manner as the thickness (e.g., H21) of the reflector layer 120 of the first and second anneal areas 212a and 212b other than the first stitching area 212c.

The second anneal patterns 222 and 224 having a line shape may fill the inside of the black border area BA. For example, the second anneal patterns 222 and 224 may extend in the first direction X or the second direction Y to fill the inside of the black border area BA defined by the first anneal patterns 212 and 214. In some embodiments of the present disclosure, a plurality of second anneal patterns 222 and 224 each having a line shape may fill the inside of the black border area BA.

In some embodiments of the present disclosure, the second anneal patterns 222 and 224 may be embodied by heat treatment according to a scan manner. For example, a laser annealing process on the inside of the black border area BA may be performed, using a scanner device. As a result, the second anneal patterns 222 and 224 that fill the inside of the black border area BA and have the line shape may be formed.

In some embodiments of the present disclosure, the plurality of second anneal patterns 222 and 224 may include a plurality of first line patterns 222 extending in the first direction X, and a plurality of second line patterns 224 extending in the second direction Y. The first line patterns 222 may extend along the side surface of the pattern area PA extending in the first direction X, and the second line patterns 224 may extend along the side surface of the pattern area PA extending in the second direction Y. In FIG. 4 although the amber of first line patterns 222 and the number of second line patterns 224 are shown as being the same as each other, this is only an example, the numbers may, of course, differ from each other.

The widths S21 and S22 of each of the second anneal patterns 222 and 224 may be, for example, about 1 μm to about 1,000 μm. Preferably, the widths S21 and S22 of each of the second anneal patterns 222 and 224 may be about 100 μm to about 500 μm. More preferably, the widths S21 and S22 of each of the second anneal patterns 222 and 224 may be about 350 μm to about 450 μm. Although the width S21 of the first line pattern 222 in the second direction and the width S22 of the second line pattern 224 in the first direction X are shown as being the same as each other, this is only an example, and the widths may, of course, differ from each other.

Also, although the sizes of each of the second anneal patterns 222 and 224 are shown as being the same as each other, the embodiment is not necessarily limited thereto. For example, some of the second anneal patterns 222 and 224 may, of course, have a different size from some others of the second anneal patterns 222 and 224. Also, although the widths S21 and S22 of each of the second anneal patterns 222 and 224 are shown as being the same as the widths S11 and S12 of each of the first anneal patterns 212 and 214, this is only an example, and the widths may, of course, differ from each other.

The reflector layer 120 may have a reduced thickness in the black border area BA. For example, as shown in FIG. 7, thicknesses (e.g., H21, H23, H24, and H25) of the reflector layer 120 of the black border area BA may be smaller than the thickness (e.g., H11) of the reflector layer 120 of the pattern area PA.

In some embodiments of the present disclosure, the plurality of second anneal patterns 222 and 224 may overlap together to form a second stitching area 222c. For example, as shown in FIG. 5, the first line patterns 222 may include a third anneal area 222a and a fourth anneal area 222b which are arranged along the second direction Y and adjacent to each other. A part of the third anneal area 222a and a part of the fourth anneal area 222b may overlap to form a second stitching area 222c that extends in the first direction X. A plurality of first line patterns 222 may be continuously arranged without disconnection through the second stitching area 222c.

In some embodiments of the present disclosure, the thickness of the reflector layer 120 of the second stitching area 222c may be adjusted in the same manner as the thickness of the reflector layer 120 of the other black border area BA. For example, as shown in FIG. 7, a height H24 of the uppermost surface of the reflector layer 120 of the second stitching area 222c may be the same as a height H23 of the uppermost surface of the reflector layer 120 of the third and fourth anneal areas 222a and 222b other than the second stitching area 222c, on the basis of the upper surface of the mask substrate 100. This may be due to the intensity of the heat treatment on the second stitching area 222c. Since this is similar to that described above referring to FIG. 8 for the first stitching area 212c, detailed description thereof will not be provided below and to the extent that a description of a given element has been omitted, it may be assumed that this element is at least similar to corresponding elements that are described elsewhere in the specification.

In some embodiments of the present disclosure, the first anneal patterns 212 and 214 and the second anneal patterns 222 and 224 may be overlap together to form a third stitching area 230. For example, as shown in FIG. 5, the first island patterns 212 may overlap the first line pattern 222 adjacent to the pattern area PA to form a third stitching area 230 that extends in the first direction X. The first island patterns 212 and the first line pattern 222 may be continuously arranged without disconnection through the third stitching area 230.

In some embodiments of the present disclosure, the thickness of the reflector layer 120 of the third stitching area 230 may be adjusted in the same manner as the thickness of the reflector layer 120 of the other black border area BA. For example, as shown in FIG. 7, a height H25 of the uppermost surface of the reflector layer 120 of the third stitching area 230 may be the same as the height H21 of the uppermost surface of the reflector layer 120 of the first and second anneal areas 212a and 212b other than the first stitching area 212c, and the height H23 of the uppermost surface of the reflector layer 120 of the third and fourth anneal areas 222a and 222b other than the second stitching area 222c, on the basis of the upper surface of the mask substrate 100. This may be due to the intensity of the heat treatment on the third stitching area 230. Since this is similar to that described above referring to FIG. 8 for the first stitching area 212c, detailed description thereof will not be provided below and to the extent that a description of a given element has been omitted, it may be assumed that this element is at least similar to corresponding elements that are described elsewhere in the specification.

In some embodiments of the present disclosure, a forbidden area FA may be defined between the pattern area PA and the black border area BA, as shown in FIG. 7. The forbidden area FA may be an area that might not be used as an area to which the pattern image is transferred due to a step between the pattern area PA and the black border area BA. A width of the forbidden area FA may be, for example, about 30 μm or less. As an example, the width of the forbidden area FA may be about 1 μm to about 30 μm.

In some embodiments of the present disclosure, the reflector layer 120 of the black border area BA may be heat-treated by a pulsed laser to reduce the width of the forbidden area FA. A pulse width of the pulsed laser may be about 1,000 ns or less. As an example, the pulse width of the pulsed laser may be about 1 ns to about 1,000 ns. In such a case, the width of the forbidden area FA may be, for example, about 10 μm or less. As an example, the width of the forbidden area FA may be about 1 μm to about 10 μm.

The black border area may prevent extreme ultraviolet rays reflected from the edge area of the reflective photomask from causing an overlap exposure with the extreme ultraviolet rays reflected from the pattern area. Such a black border area may be embodied by heat treatment performed along the edges of the pattern area. The heat treatment may be performed by a step manner or a scan manner. However, the black border area formed using only the step manner has a problem of low productivity due to the slow processing speed of the step manner, and the black border area formed using only the scan manner has a problem of low accuracy due to the scan manner which has a difficulty in fine adjustment.

However, in the reflective photomask according to some embodiments of the present disclosure, the edge of the black border area BA may be formed by heat treatment according to the step manner, and the inside of the black border area BA may be formed by heat treatment according to the scan manner. Specifically, as described above, since the first anneal patterns 212 and 214 arranged along the edge of the black border area BA are formed by the step manner, the boundaries of the black border area BA may be defined accurately, and the width of the forbidden area FA may be kept narrow. Further, since the second anneal patterns 222 and 224 that fill the inside of the black border area BA are formed by the scan manner, it is possible to shorten the process time. Accordingly, a reflective photomask in which both accuracy and productivity are increased may be provided.

Figure 9:
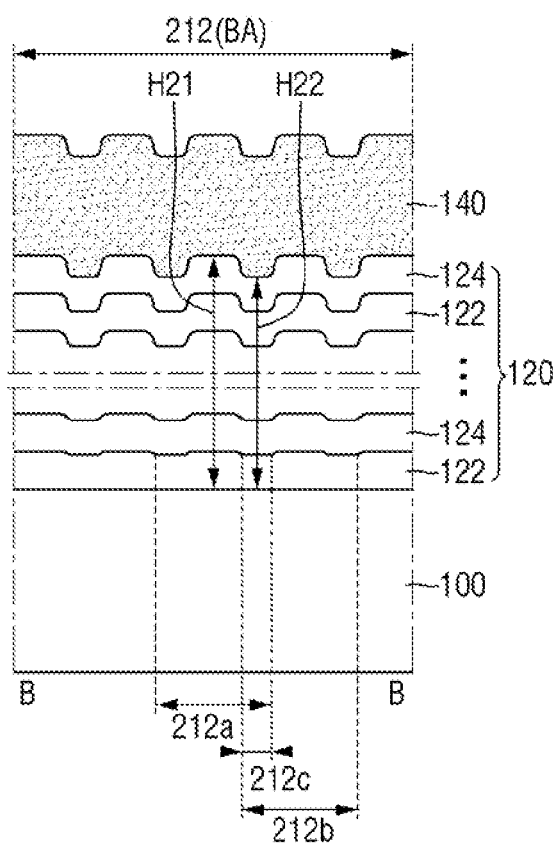
FIG. 9 is a schematic cross-sectional view taken along B-B of FIG. 5.
Figure 10:
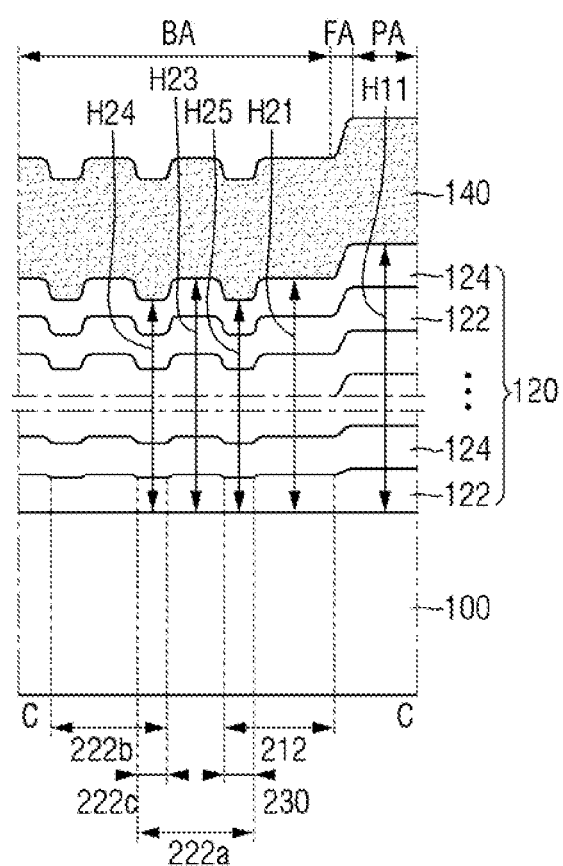
FIG. 10 is a schematic cross-sectional view taken along C-C of FIG. 5.
Figure 11:
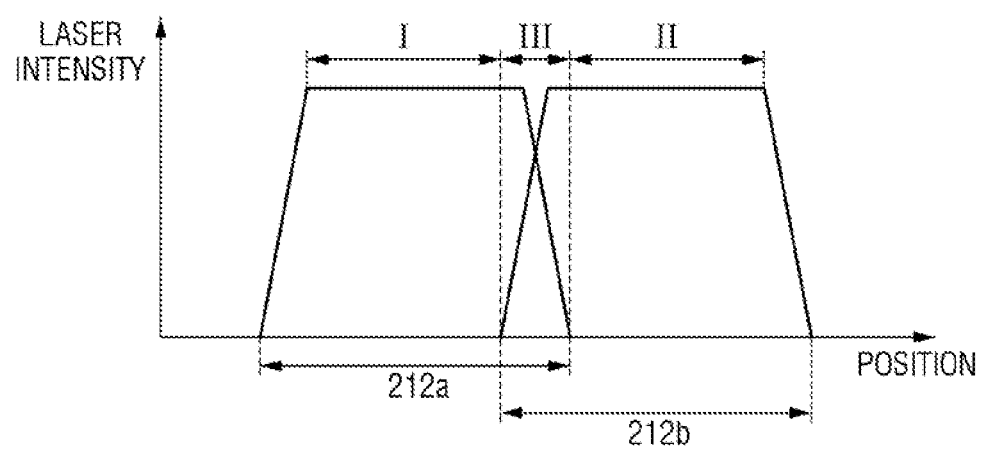
FIG. 11 is a graph illustrating the stitching areas of FIGS. 9 and 10.

FIG. 9 is a schematic cross-sectional view taken along B-B of FIG. 5. FIG. 10 is a schematic cross-sectional view taken along C-C of FIG. 5. FIG. 11 is a graph illustrating the stitching areas of FIGS. 9 and 10. For convenience of explanation, repeated parts of contents explained above using FIGS. 1 to 8 will be briefly explained or omitted and to the extent that a description of a given element has been omitted, it may be assumed that this element is at least similar to corresponding elements that are described elsewhere in the specification.

Referring to FIGS. 9 to 11, in the reflective photomask according to some embodiments of the present disclosure, the thickness of the reflector layer 120 of the first stitching area 212c may be smaller than the thickness of the reflector layer 120 of the first and second anneal areas 212a and 212b other than first stitching area 212c.

For example, the height H22 of the uppermost surface of the reflector layer 120 of the first stitching area 212c may be smaller than the height H21 of the uppermost surface of the reflector layer 120 of the second anneal areas 212a and 212b other than the first stitching area 212c, on the basis of the upper surface of the mask substrate 100.

This may be due to the intensity of the heat treatment on the first stitching area 212c. As an example, as shown in FIG. 11, the intensity of the laser applied to the third area III may be stronger than intensity of the laser applied to the first area I and the second area II. In such a case, the thickness (e.g., H22) of the reflector layer 120 of the first stitching area 212c may be smaller than the thickness (e.g., H21) of the reflector layer 120 of the first and second anneal areas 212a and 212b other than the first stitching area 212c.

In some embodiments of the present disclosure, the thickness of the reflector layer 120 of the second stitching area 222c may be smaller than the thickness of the reflector layer 120 of the third and fourth anneal areas 222a and 222b other than the second stitching area 222c. For example, as shown in FIG. 10, a height H24 of the uppermost surface of the reflector layer 120 of the second stitching area 222c may be smaller than a height H23 of the uppermost surface of the reflector layer 120 of the third and fourth anneal areas 222a and 222b other than the second stitching area 222c, on the basis of the upper surface of the mask substrate 100. This may be due to the intensity of the heat treatment on the second stitching area 222c. Since this is similar to that described above referring to FIG. 11 for the first stitching area 212c, detailed description thereof will not be provided below and to the extent that a description of a given element has been omitted, it may be assumed that this element is at least similar to corresponding elements that are described elsewhere in the specification.

In some embodiments of the present disclosure, the thickness of the reflector layer 120 of the third stitching area 230 may be smaller than the thickness of the reflector layer 120 of the first and second anneal areas 212a and 212b other than the first stitching area 212c, and the thickness of the reflector layer 120 of the third and fourth anneal areas 222a and 222b other than the second stitching area 222c. For example, as shown in FIG. 10, a height H25 of the uppermost surface of the reflector layer 120 of the third stitching area 230 may be smaller than the height H21 of the uppermost surface of the reflector layer 120 of the first and second anneal areas 212a and 212b other than the first stitch area 212c, and the height H23 of the uppermost surface of the reflector layer 120 of the third and fourth anneal area 222a and 222b other than the second stitching area 222c, on the basis of the upper surface of the mask substrate 100. This may be due to the intensity of the heat treatment on the third stitching area 230. Since this is similar to that described above using FIG. 11 for the first stitching area 212c, detailed description thereof will not be provided below and to the extent that a description of a given element has been omitted, it may be assumed that this element is at least similar to corresponding elements that are described elsewhere in the specification.

Figure 12:
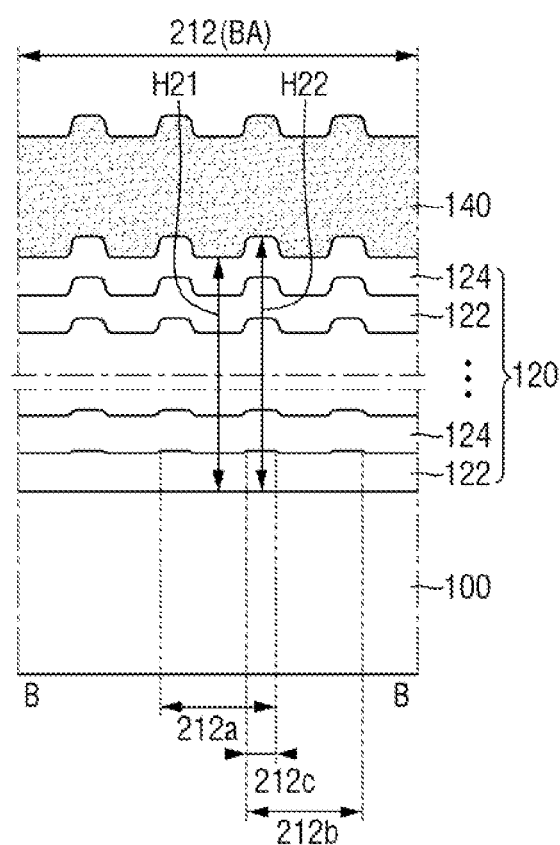
FIG. 12 is a schematic cross-sectional view taken along B-B of FIG. 5.
Figure 13:
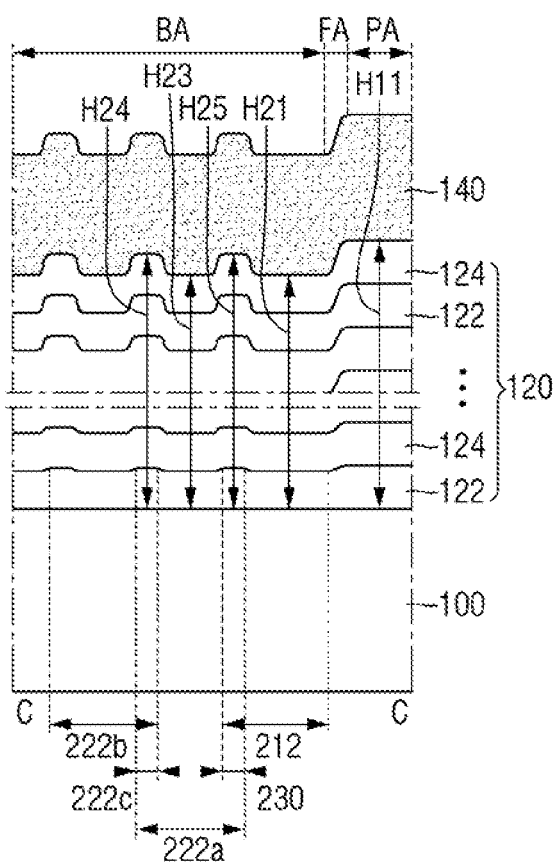
FIG. 13 is a schematic cross-sectional view taken along C-C of FIG. 5.
Figure 14:
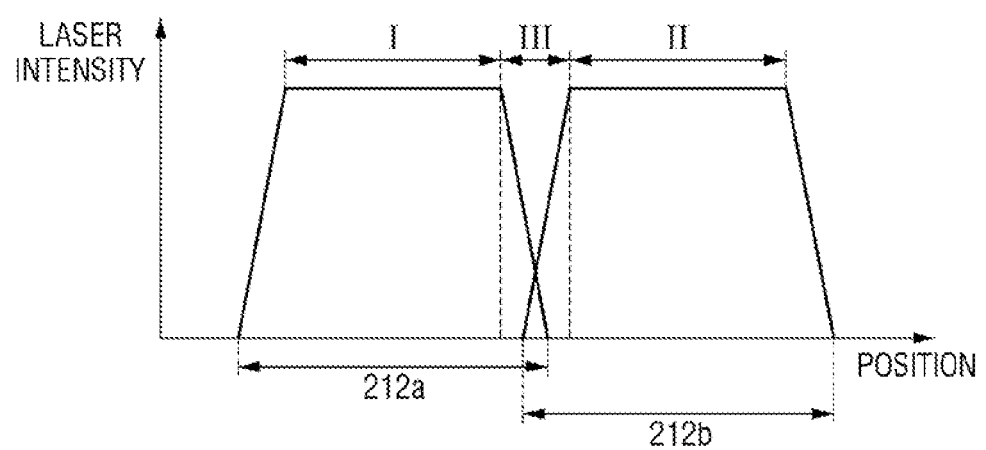
FIG. 14 is a graph illustrating the stitching area of FIGS. 12 and 13.

FIG. 12 is a schematic cross-sectional view taken along B-B of FIG. 5. FIG. 13 is a schematic cross-sectional view taken along C-C of FIG. 5. FIG. 14 is a graph illustrating the stitching area of FIGS. 12 and 13. For convenience of explanation, repeated parts of contents explained above using FIGS. 1 to 8 will be briefly explained or omitted and to the extent that a description of a given element has been omitted, it may be assumed that this element is at least similar to corresponding elements that are described elsewhere in the specification.

Referring to FIGS. 12 to 14, in the reflective photomask, according to some embodiments of the present disclosure, the thickness of the reflector layer 120 of the first stitching area 212c may be greater than the thickness of the reflector layer 120 of the first and second anneal areas 212a and 212b other than the first stitching area 212c.

For example, the height H22 of the uppermost surface of the reflector layer 120 of the first stitching area 212c may be smaller than the height H21 of the uppermost surface of the reflector layer 120 of the second anneal areas 212a and 212b other than the first stitching area 212c, on the basis of the upper surface of the mask substrate 100.

This may be due to the intensity of the heat treatment on the first stitching area 212c. As an example, as shown in FIG. 14, the intensity of the laser applied to the third area III may be weaker than that of the laser applied to the first area I and the second area II. In such a case, the thickness (e.g., H22) of the reflector layer 120 of the first stitching area 212c may be greater than the thickness (e.g., H21) of the reflector layer 120 of the first and second anneal areas 212a and 212b other than the first stitching area 212c.

In some embodiments of the present disclosure, the thickness of the reflector layer 120 of the second stitching area 222c may be greater than the thickness of the reflector layer 120 of the third and fourth anneal areas 222a and 222b other than the second stitching area 222c. For example, as shown in FIG. 12, the height H24 of the uppermost surface of the reflector layer 120 of the second stitching area 222c may be greater than the height H23 of the uppermost surface of the reflector layer 120 of the third and fourth anneal areas 222a and 222b other than the second stitching area 222c, on the basis of the upper surface of the mask substrate 100. This may be due to the intensity of the heat treatment on the second stitching area 222c. Since this is similar to that described above using FIG. 14 for the first stitching area 212c, detailed description thereof will not be provided below and to the extent that a description of a given element has been omitted, it may be assumed that this element is at least similar to corresponding elements that are described elsewhere in the specification.

In some embodiments of the present disclosure, the thickness of the reflector layer 120 of the thud stitching area 230 may be greater than the thickness of the reflector layer 120 of the first and second anneal areas 212a and 212b other than the first stitching area 212c, and the thickness of the reflector layer 120 of the third and fourth anneal areas 222a and 222b other than the second stitching area 222c. For example, as shown in FIG. 13, a height H25 of the uppermost surface of the reflector layer 120 of the third stitching area 230 may be greater than the height H21 of the uppermost surface of the reflector layer 120 of the first and second anneal areas 212a and 212b other than the first stitching area 212c, and the height H23 of the uppermost surface of the reflector layer 120 of the third and fourth anneal areas 222a and 222b other than the second stitching area 222c, on the basis of the upper surface of the mask substrate 100. This may be due to the intensity of the heat treatment on the third stitching area 230.

Since this is similar to that described above using 14 for the first stitching area 212c, detailed description thereof will not be provided below and to the extent that a description of a given element has been omitted, it may be assumed that this element is at least similar to corresponding elements that are described elsewhere in the specification.

FIGS. 15 to 18 are various enlarged views illustrating the R1 area of FIG. 2. For convenience of explanation, repeated pans of contents explained above using FIGS. 1 to 14 will be briefly explained or omitted and to the extent that a description of a given element has been omitted, it may be assumed that this element is at least similar to corresponding elements that are described elsewhere in the specification.

Figure 15:
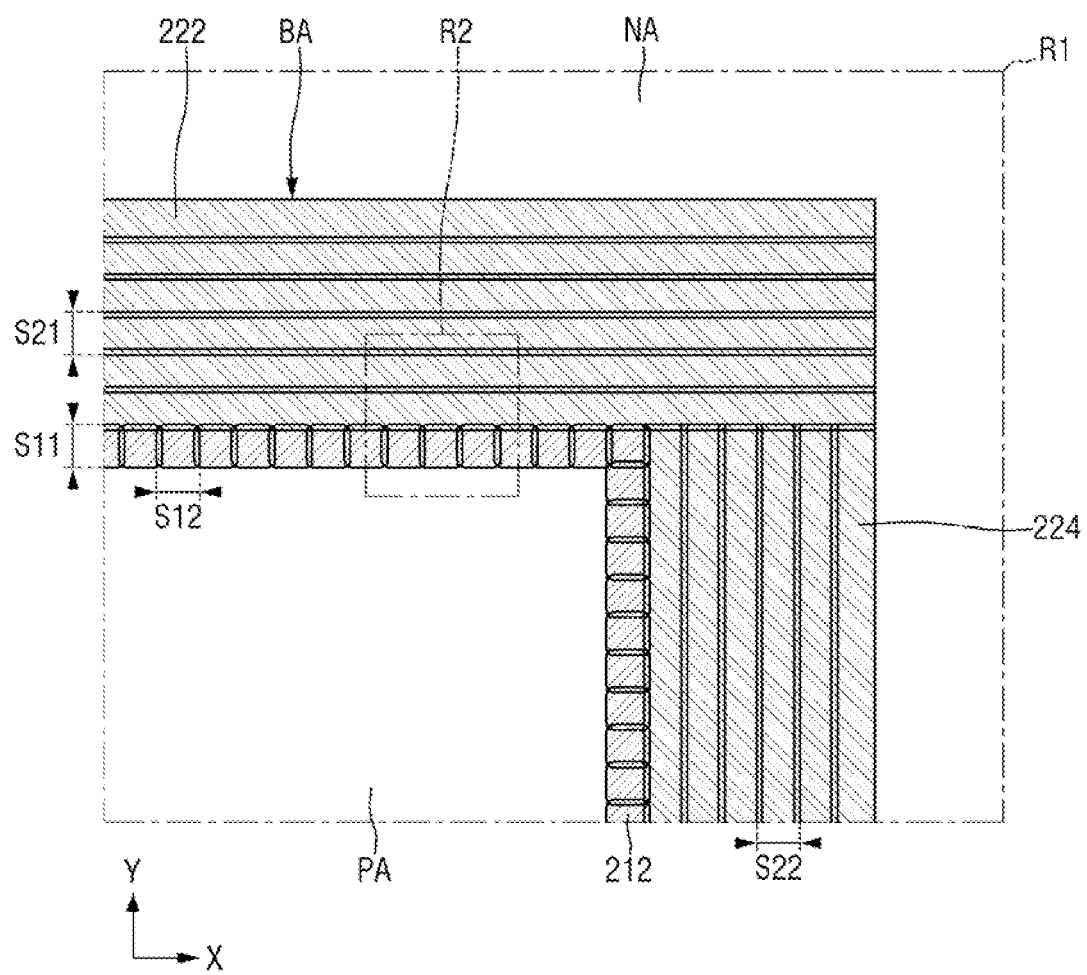
FIGS. 15 to 18 are various enlarged views illustrating the R1 area of FIG. 2.

Referring to FIG. 15, in the reflective photomask according to some embodiments of the present disclosure, an outer edge of the black border area BA (i.e., an edge of the black border area BA adjacent to the non-pattern area NA) may be defined by the second anneal patterns 222 and 224.

For example, the black border area BA might not include the second island pattern 214 of FIG. 4. This makes it possible to provide a reflective photomask with further increased productivity by minimizing the use of the step manner.

Figure 16:
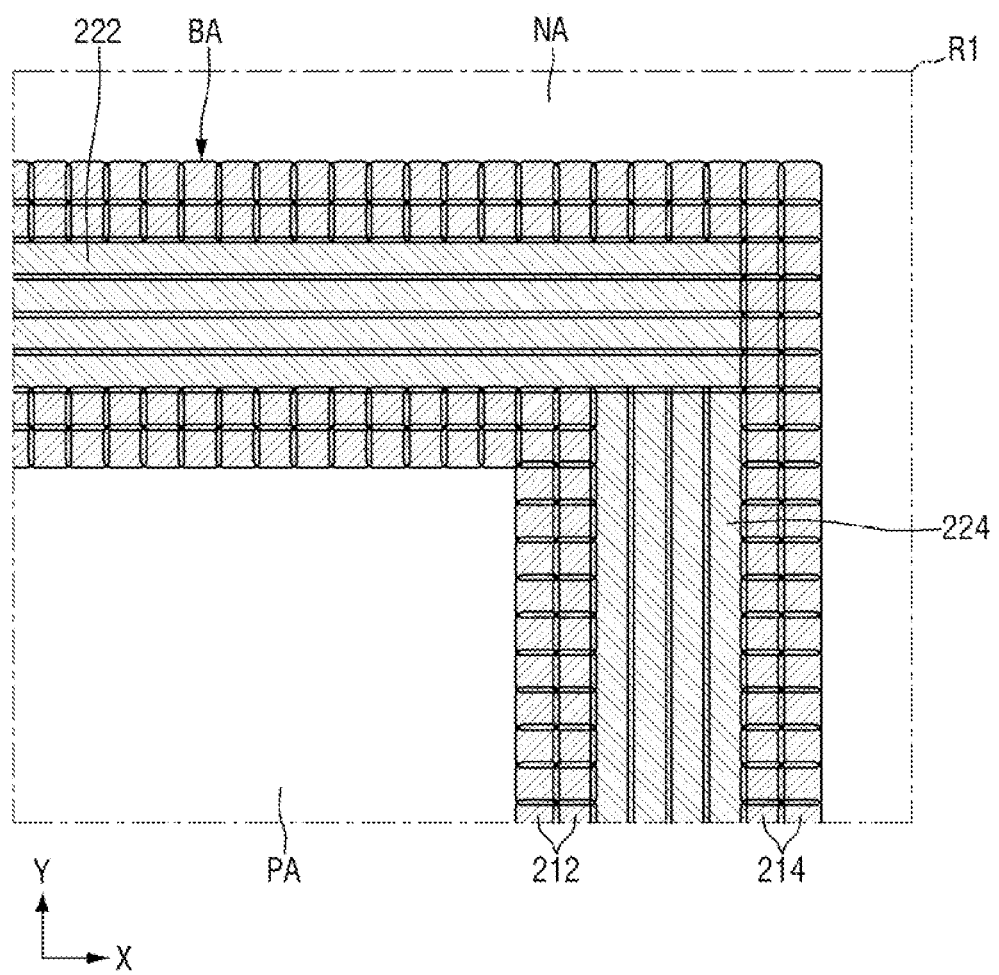

Referring to FIG. 16, in the reflective photomask according to some embodiments of the present disclosure, the first island patterns 212 and/or the second island patterns 214 may be formed in a plurality of rows.

For example, as shown, the first island patterns 212 arranged along the inner edge of the black border area BA may be formed in two rows, and the second island patterns 214 arranged along the outer edge of the black border area BA may be formed in two rows. Although the first island patterns 212 and the second island patterns 214 are all shown as being formed in a plurality of rows, this is only an example, and at least one of the first island patterns 212 and the second island patterns 214 may, of course, be formed in a row.

Figure 17:
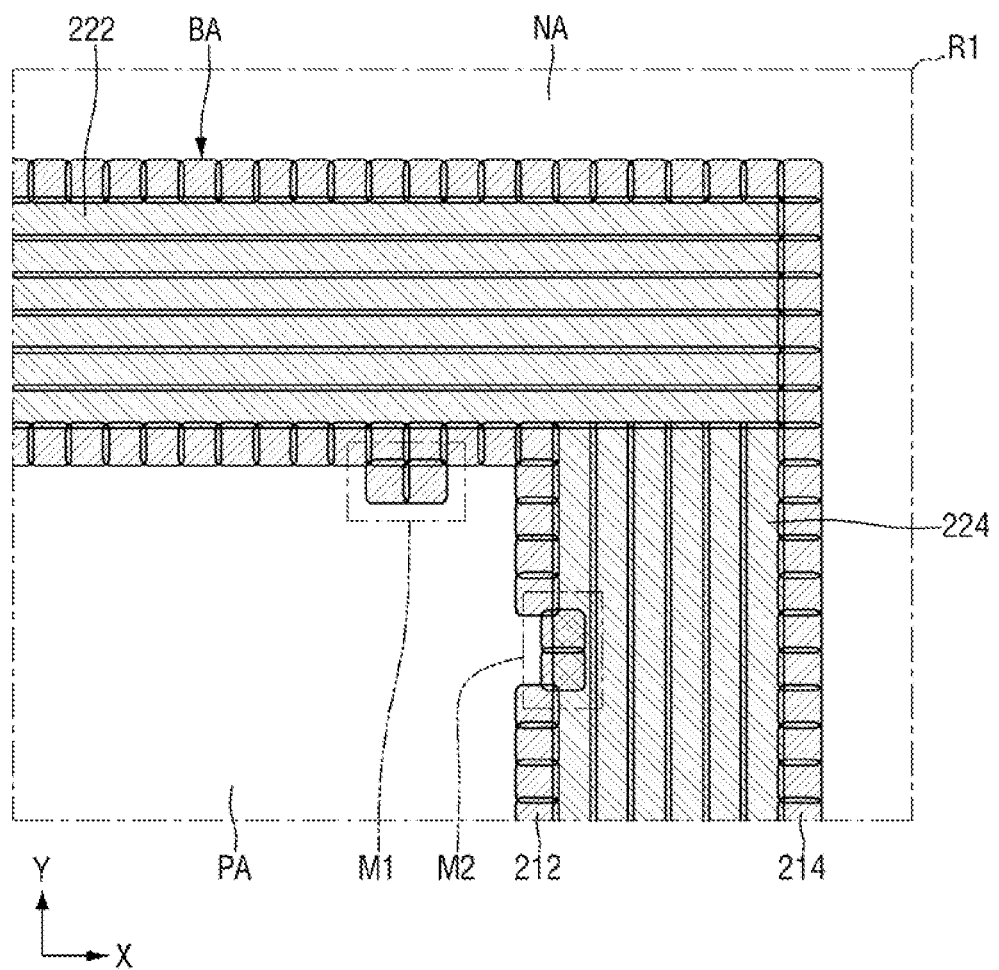

Referring to FIG. 17, in the reflective photomask, according to some embodiments of the present disclosure, the first anneal patterns 212 and 214 may include key anneal patterns M1 and M2.

The key anneal patterns M1 and M2 may be used to accurately align the pattern area PA in a lithography process which uses the reflective photomask according to some embodiments of the present disclosure.

In some embodiments of the present disclosure, the key anneal patterns M1 and M2 may include a first key anneal pattern M1 and a second key anneal pattern M2. The first key anneal pattern M1 may protrude toward the pattern area PA. As an example as shown, the first key anneal pattern M1 may protrude toward the pattern area PA from the first island patterns 212 arranged along the first direction X. The second key anneal pattern M2 may protrude toward the second anneal patterns 222 and 224. As an example, as shown, the second key anneal pattern M2 may protrude from the first island patterns 212 arranged along the second direction Y toward the second anneal patterns 222 and 224.

Figure 18:
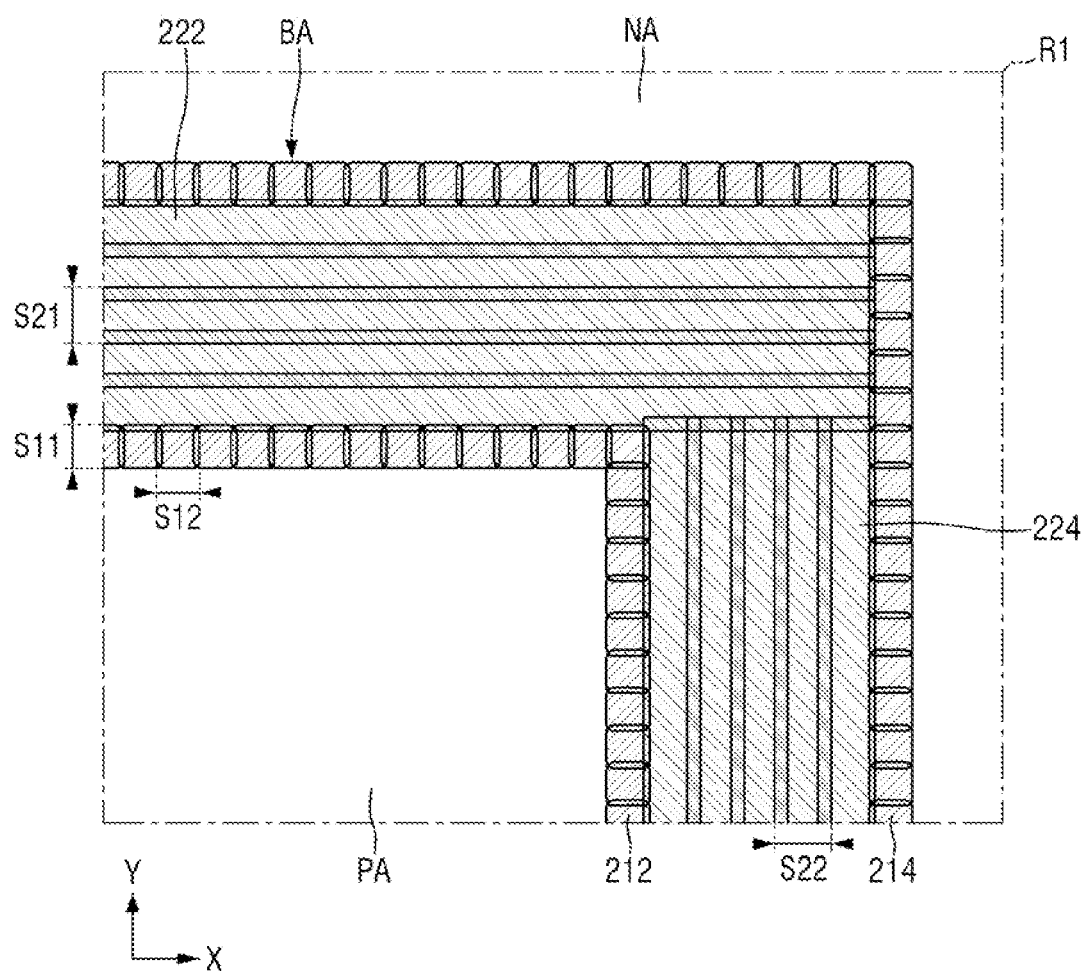

Referring to FIG. 18, in the reflective photomask, according to some embodiments of the present disclosure, the widths S21 and S22 of the respective second anneal patterns 222 and 224 may be greater than the widths S11 and S12 of the respective first anneal patterns 212 and 214.

For example, the width S21 of the first line pattern 222 in the second direction Y may be greater than the width S11 of the first anneal patterns 212 and 214 in the second direction Y. Alternatively, for example, the width S22 of the second line pattern 224 in the first direction X may be greater than the width S12 of the first anneal patterns 212 and 214 in the first direction X.

As an example, the widths S11 and S12 of each of the first anneal patterns 212 and 214 may be about 100 μm to about 250 μm, and the widths S21 and S22 of each of the second anneal patterns 222 and 224 may be about 200 μm to about 500 μm. Preferably, the widths S11 and S12 of each of the first anneal patterns 212 and 214 may be about 180 μm to about 220 μm, and the widths S21 and S22 of each of the second anneal patterns 222 and 224 may be about 350 μm to about 450 μm.

Hereinafter, the reflective photomask according to the exemplary embodiments will be described referring to FIGS. 1 to 27.

Figure 19:
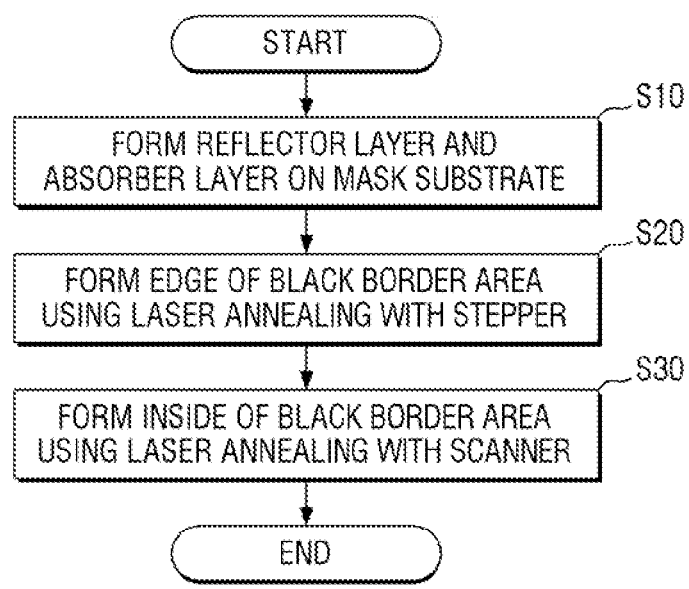
FIG. 19 is a flowchart illustrating a method for fabricating a reflective photomask according to some embodiments of the present disclosure.
Figure 20:
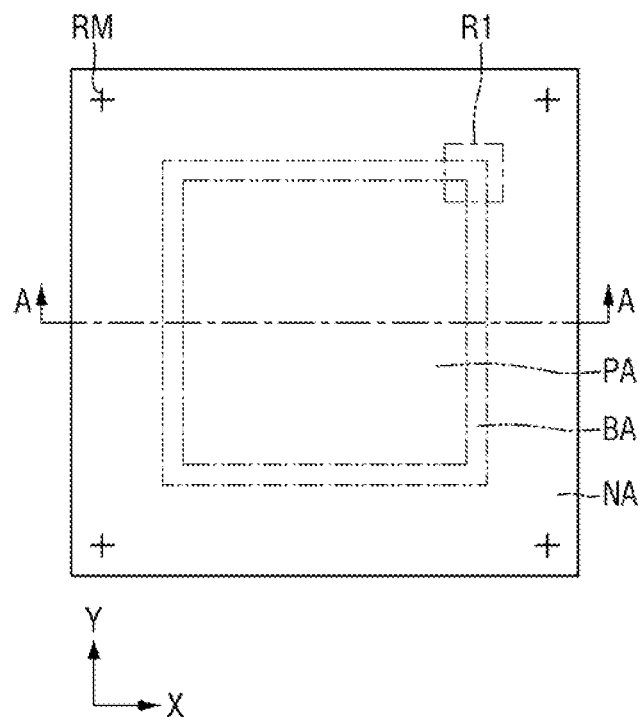
FIGS. 20 to 24 are intermediate stage diagrams illustrating the method for fabricating the reflective photomask according to FIG. 19.
Figure 21:
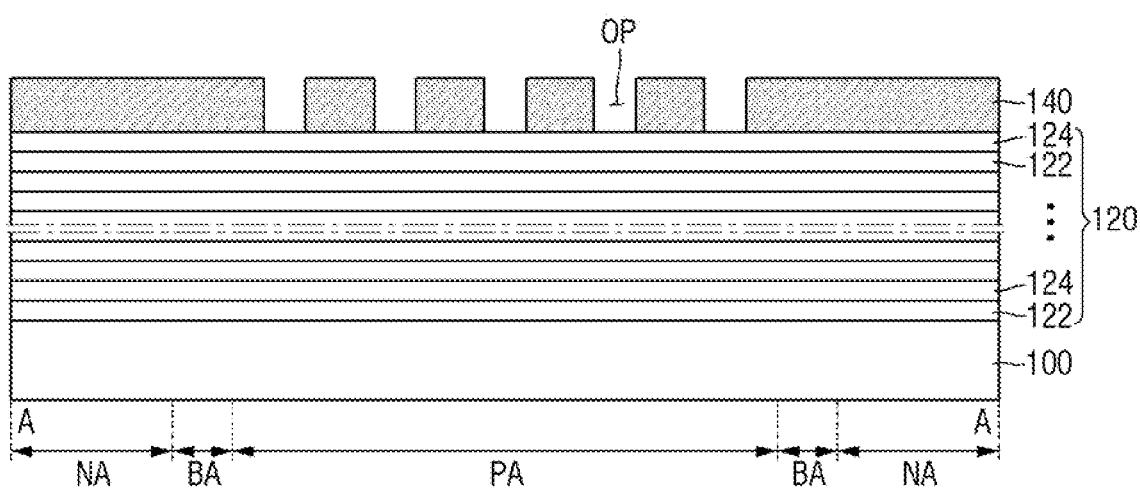
Figure 22:
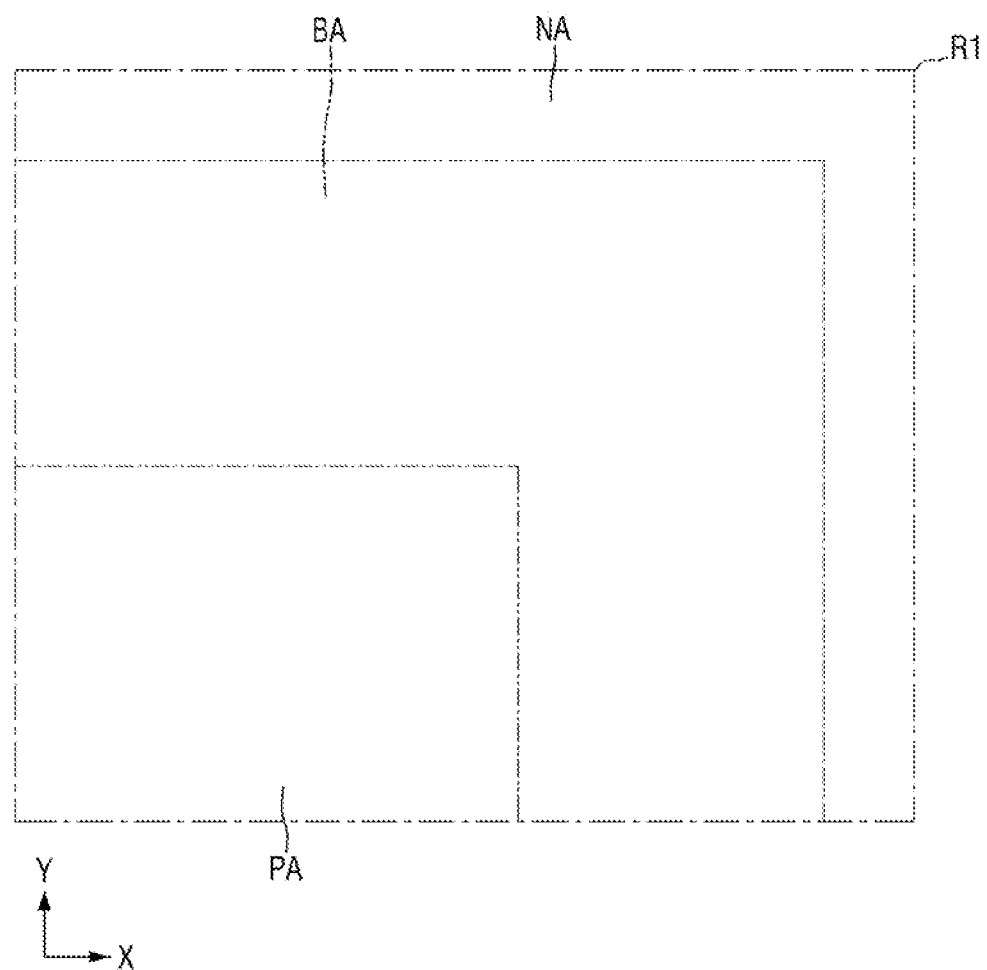

FIG. 19 is a flowchart illustrating a method for fabricating a reflective photomask according to some embodiments of the present disclosure. FIGS. 20 to 24 are intermediate stage diagrams illustrating the method for fabricating the reflective photomask according to FIG. 19. For convenience of explanation, repeated parts of contents explained above using FIGS. 1 to 18 will be briefly described or omitted and to the extent that a description of a given element has been omitted, it may be assumed that this element is at least similar to corresponding elements that are described elsewhere in the specification.

Referring to FIGS. 19 to 22, the reflector layer 120 and the absorber layer 140 are formed on the mask substrate 100 (S10).

The mask substrate 110 may include, but is not necessarily limited to including, for example synthetic quartz glass, quartz glass, alumina silicate glass, sodalime glass, and/or $SiO_2$—$TiO_2$-based glass.

The reflector layer 120 may be stacked on the mask substrate 100. In some embodiments of the present disclosure, the reflector layer 120 may include a low-refractive index layer 122 and a high-refractive index layer 124 that are alternately stacked on the mask substrate 100. As an example, the low-refractive index layer 122 may include molybdenum (Mo), and the high-refractive index layer 124 may include (Si). As an example, the thickness of the low-refractive index layer 122 and the high-refractive index layer 124 may be about 2 nm to about 5 nm, respectively.

The absorber layer 140 may be stacked on the reflector layer 120. The absorber layer 140 may include an opening OP that exposes at least a part of the reflector layer 120 of the pattern area PA. The absorber layer 140 may include, but is not necessarily limited to including, for example, at least one of TaN, TaHf, TaHfN, TaBSi, TaBSiN, TaB, TaBN, TaSi, TaSiN, TaGe, TaGeN, TaZr and TaZrN.

Figure 23:
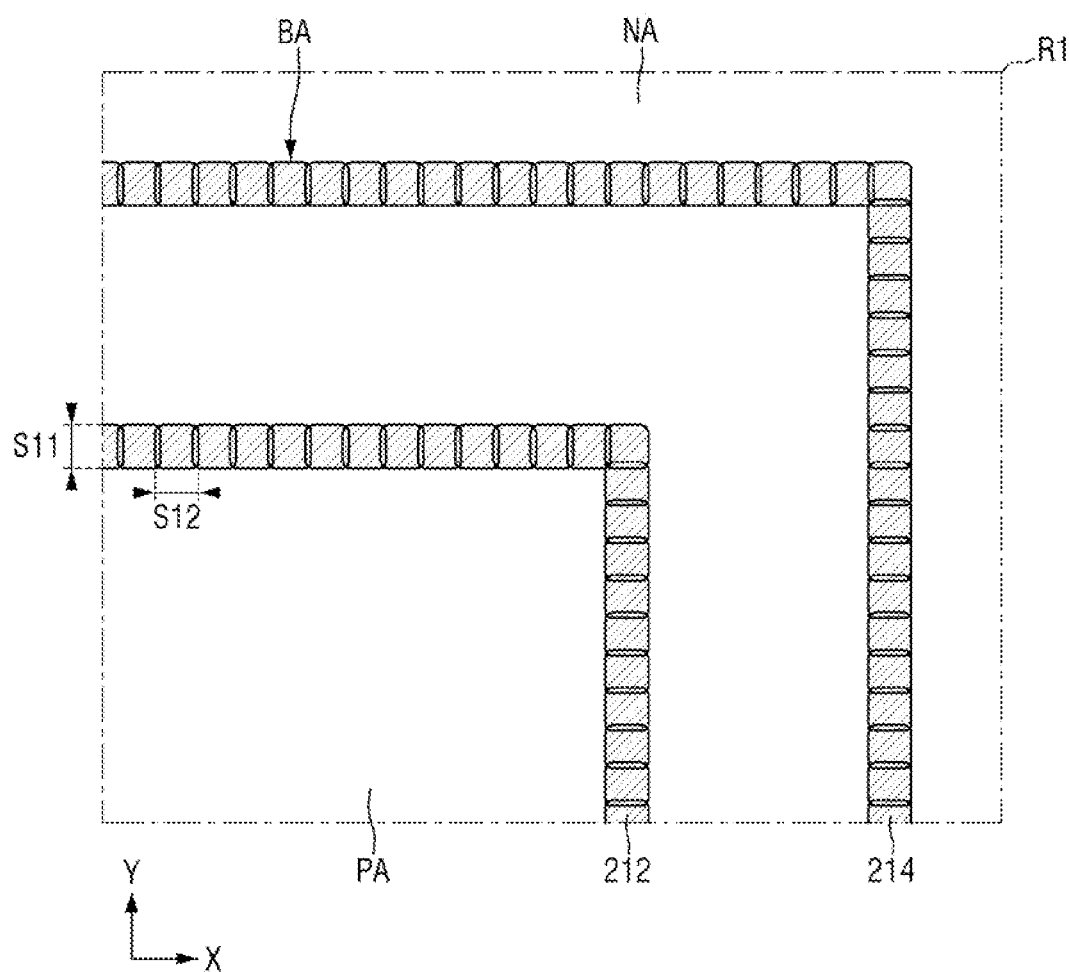

Referring to FIGS. 19 and 23, the edge of the black border area BA is formed, using the step manner (S20).

For example, a first annealing process may be performed at the edge of the black border area BA, using a step manner that does not move the stage on which the photomask is placed while the laser is applied. In some embodiments of the present disclosure, the first annealing process may include a laser annealing treatment that uses a laser. For example, a square beam shaped laser with a top-hat intensity distribution may be applied sequentially along the edge of the black border area BA. As a result, the first anneal patterns 212 and 214 arranged along the edge of the black border area BA may be formed.

A wavelength of the laser used in the first annealing process may be, for example, about 100 nm to about 2,000 nm. Preferably, the wavelength of the laser may be about 190 nm to about 1,100 nm. A dose of the laser may be, for example, about 10 mJ/cm² to about 5,000 mJ/cm². Preferably, the dose of the laser may be about 100 mJ/cm² to about 1,000 mJ/cm². The laser may be a continuous wave (CW) type or a pulse type. The continuous wave type laser means a laser that is continuously applied without being turned on/off. The pulse type laser means a laser that is periodically turned on/off and applied discontinuously.

Figure 24:
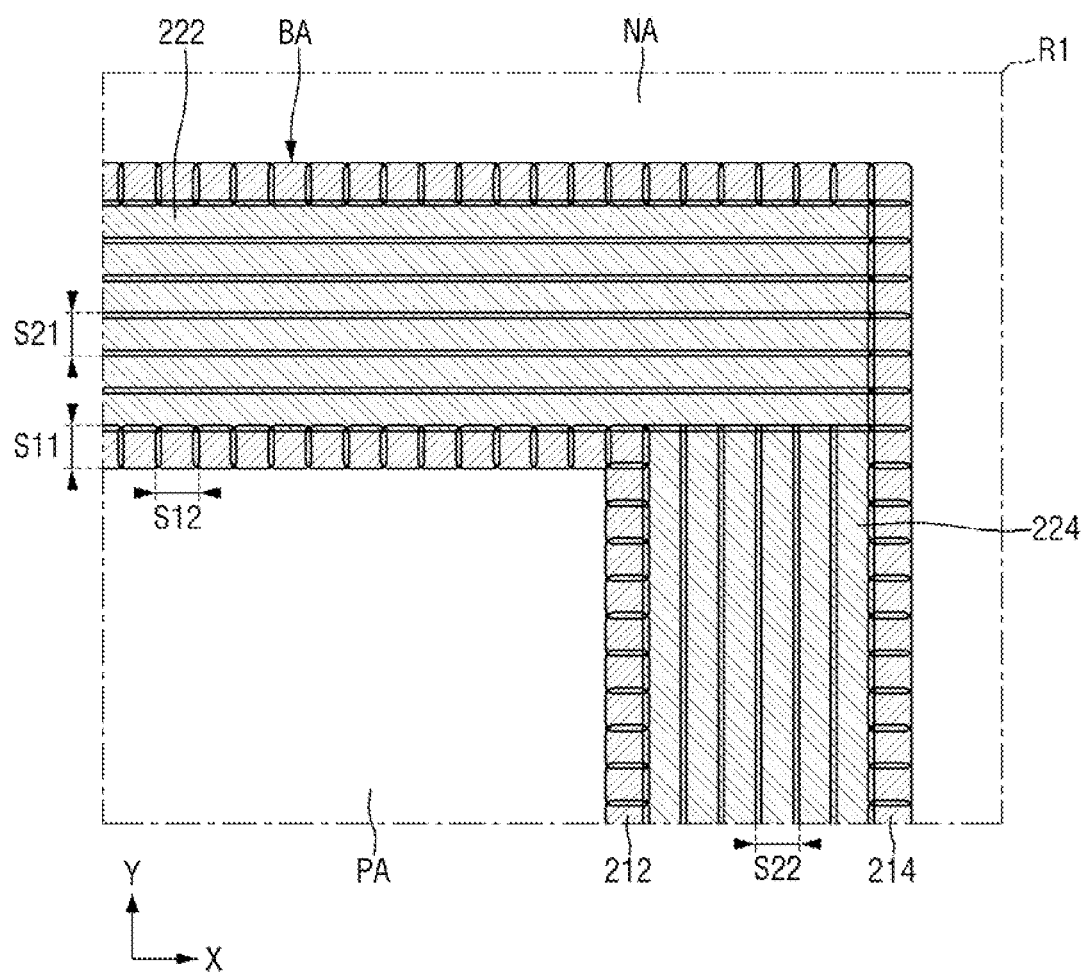

Subsequently, referring to FIGS. 19 and 24, the inside of the black border area BA is formed, using the scan manner (S30).

For example, a second annealing process may be performed on the inside of the black border area BA, using a scan manner that moves the stage on which the photomask is placed while the laser is being applied. In some embodiments of the present disclosure, the second annealing process may include a laser annealing, treatment that uses the laser. As an example, a line beam shaped laser may be applied, while moving inside the black border area BA. As an example, a square beam shaped laser with a top-hat intensity distribution may be applied, while moving inside the black border area BA. As a result, the second anneal patterns 222 and 224 that fill the inside of the black border area BA may be formed. The laser used in the second annealing process may be the same as or different from the laser used in the first annealing process.

Accordingly, a method for fabricating a reflective photomask with increased accuracy and productivity may be provided.

Figure 25:
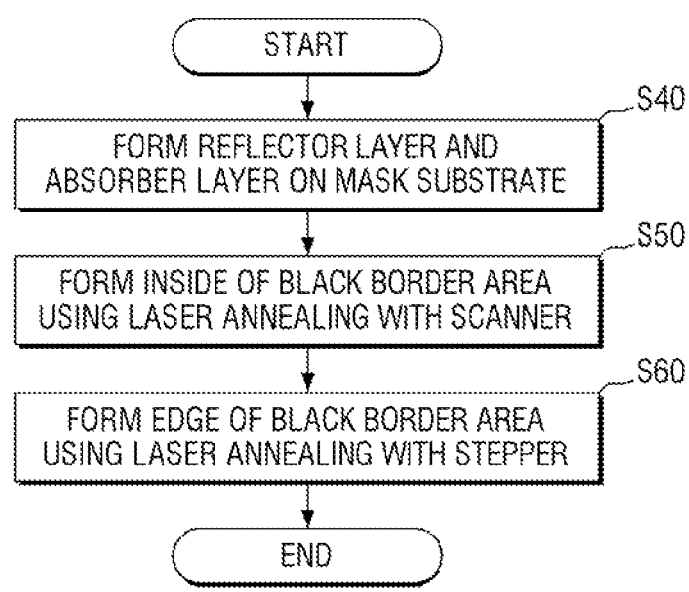
FIG. 25 is a flowchart illustrating a method for fabricating a reflective photomask according to some embodiments of the present disclosure.
Figure 26:
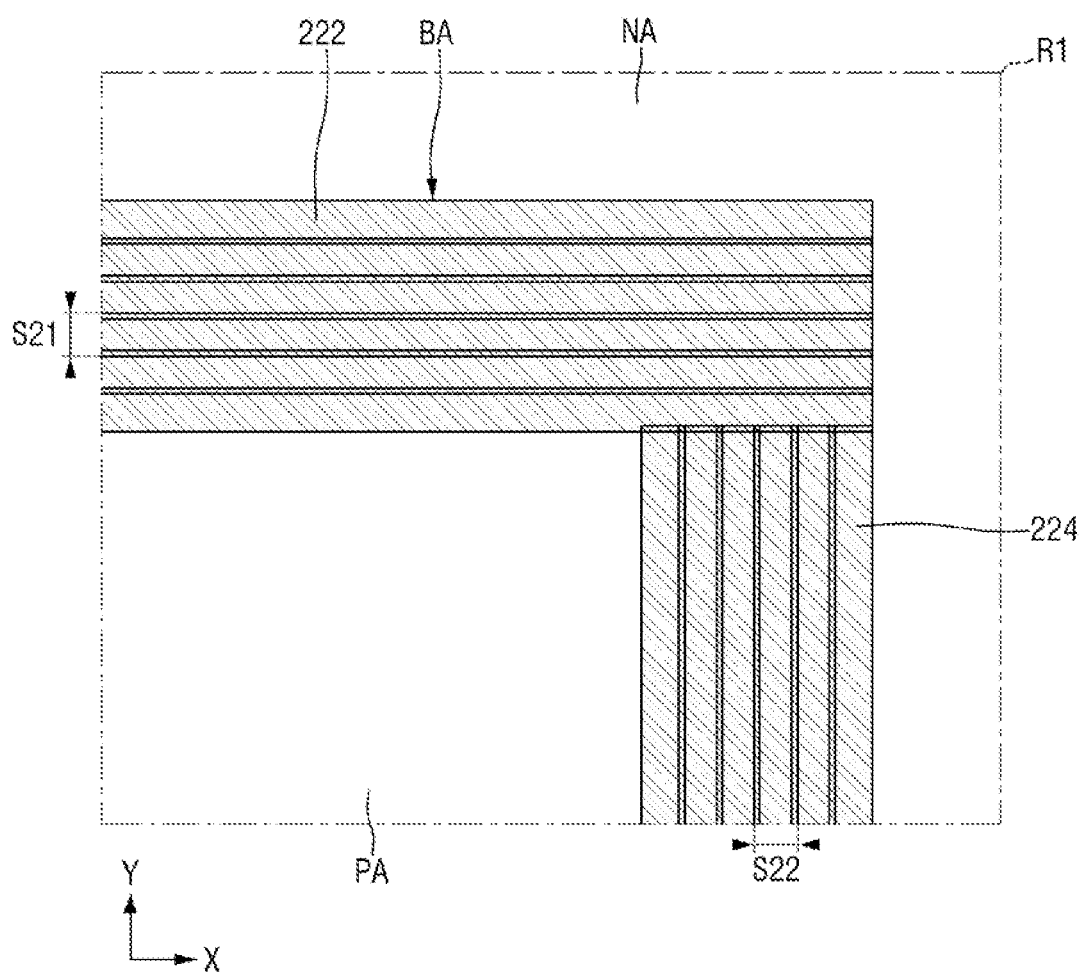
FIGS. 26 and 27 are intermediate stage diagrams illustrating the method for fabricating the reflective photomask according to FIG. 25.
Figure 27:
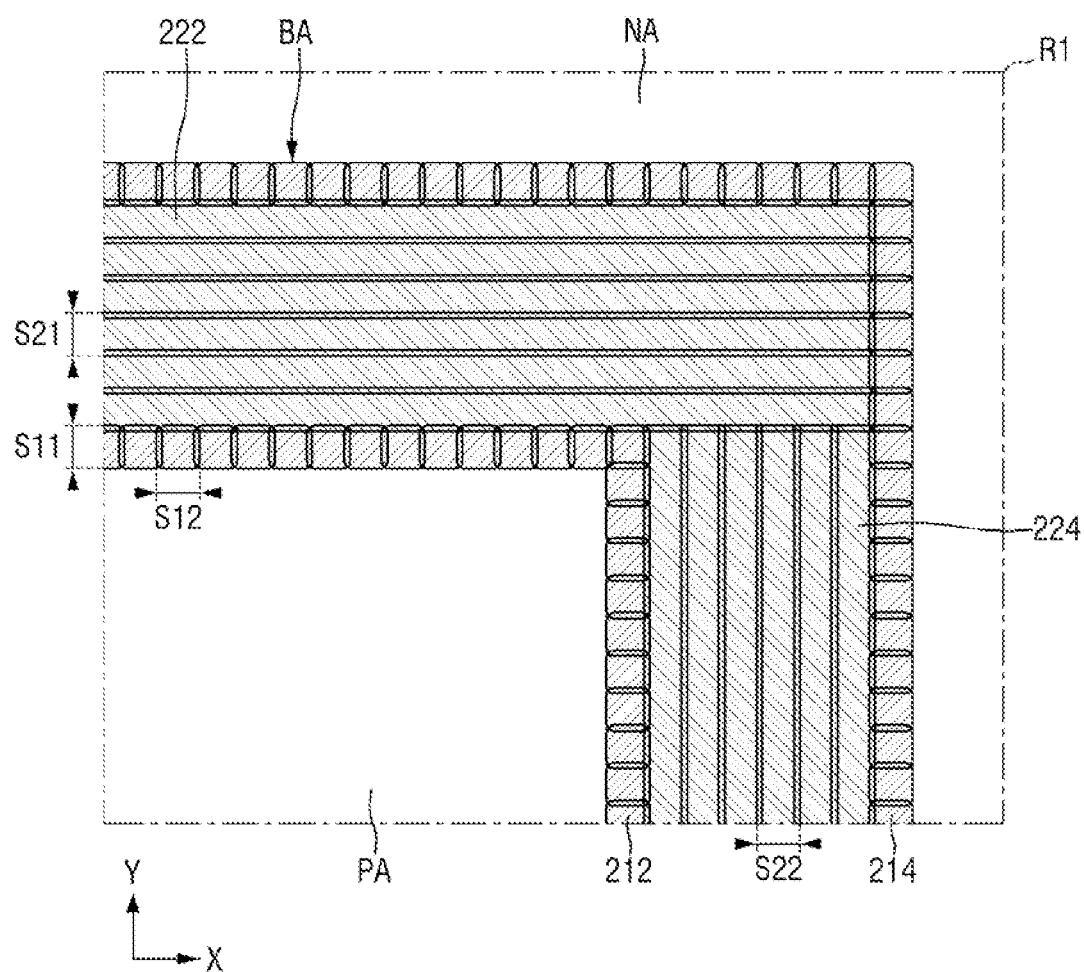

FIG. 25 is a flowchart illustrating a method for fabricating a reflective photomask according to some embodiments of the present disclosure. FIGS. 26 and 27 are intermediate stage diagrams illustrating the method for fabricating the reflective photomask according to FIG. 25. For convenience of explanation, repeated parts of contents explained above using FIGS. 1 to 24 will be briefly explained or omitted and to the extent that a description of a given element has been omitted, it may be assumed that this element is at least similar to corresponding elements that are described elsewhere in the specification. For reference, FIG. 26 is an intermediate stage diagram illustrating the procedure after FIG. 22.

Referring to FIGS. 25 and 26, a reflector layer and absorber layer are formed on a mask substrate (S40). The inside of the black border area BA is formed using the scan manner (S50). Since formation (S50) of the inside of the black border area BA using the scan manner is similar to that described above in the description of FIG. 24, detailed description thereof will not be provided below and to the extent that a description of a given element has been omitted, it may be assumed that this element is at least similar to corresponding elements that are described elsewhere in the specification.

Subsequently, referring to FIGS. 25 and 27, the edge of the black border area BA is formed, using the step manner (S60). Since formation (S20) of the edge of the black border area BA using the step manner is similar to that described above in the description of FIG. 23, detailed description thereof will not be provided below.

Accordingly, a method for fabricating a reflective photomask with increased accuracy and productivity may be provided.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A reflective photomask, comprising:
    a pattern area;
    a non-pattern area at least partially surrounding the pattern area;
    a black border area interposed between the pattern area and the non-pattern area;
    a mask substrate;
    a reflector layer stacked on the mask substrate; and
    an absorber layer stacked on the reflector layer,
    wherein the black border area includes a plurality of first anneal patterns which are arranged along an edge of the pattern area and each have an island shape, and a second anneal pattern which fills an inside of the black border area and has a line shape.

2. The reflective photomask of claim 1, wherein a thickness of the reflector layer of the black border area is smaller than each of a thickness of the reflector layer of the pattern area and a thickness of the reflector layer of the non-pattern area.

3. The reflective photomask of claim 2, wherein the plurality of first anneal patterns include first and second anneal areas adjacent to each other, and a stitching area in which the first and second anneal areas at least partially overlap.

4. The reflective photomask of claim 2, wherein the second anneal pattern includes first and second anneal areas adjacent to each other, and a stitching area in which the first and second anneal areas at least partially overlap.

5. The reflective photomask of claim 1, wherein the plurality of first anneal patterns includes a key anneal pattern protruding toward the pattern area.

6. The reflective photomask of claim 1, wherein the plurality of first anneal patterns includes a key anneal pattern protruding toward the second anneal pattern.

7. The reflective photomask of claim 1, wherein the plurality of first anneal patterns includes a plurality of first island patterns interposed between the pattern area and the second anneal pattern, and a plurality of second island patterns interposed between the non-pattern area and the second anneal pattern.

8. The reflective photomask of claim 1, wherein the second anneal pattern includes a first line pattern extending in a first direction parallel to an upper surface of the mask substrate, and a second line pattern which extends in a second direction parallel to the upper surface of the mask substrate and intersecting the first direction.

9. The reflective photomask of claim 1, wherein the reflector layer includes a low-refractive index layer, and a high-refractive index layer having a higher refractive index than the low-refractive index layer, and
    wherein the low-refractive index layer and the high-refractive index layer are alternately stacked on the mask substrate.

10. The reflective photomask of claim 1, wherein the absorber layer includes an opening which exposes at least a part of the reflector layer of the pattern area.

11. A reflective photomask comprising:
    a pattern area;
    a Hack boarder area at least partially surrounding the pattern area;
    a mask substrate;
    a reflector layer stacked on the mask substrate; and
    an absorber layer stacked on the reflector layer,
    wherein the black border areas includes first and second anneal areas which are arranged along an edge of the pattern area and each have an island shape, a first stitching area in which the first and second anneal areas at least partially overlap, and a third anneal area which is separated from the pattern area, wherein the first and second anneal areas are interposed between the third anneal area and the pattern area and has a line shape, and wherein a thickness of the reflector layer of the black border area is smaller than a thickness of the reflector layer of the pattern area.

12. The reflective photomask of claim 11, wherein the first and second anneal areas are arranged along a first direction parallel to an upper surface of the mask substrate, wherein the first and third anneal areas are arranged along a second direction parallel to the upper surface of the mask substrate and intersecting the first direction, and wherein the third anneal area extends along in the first direction.

13. The reflective photomask of claim 12, wherein a width of the third anneal area in the second direction is greater than a width of each of the first and second anneal areas in the second direction.

14. The reflective photomask of claim 11, wherein the black border area further includes a fourth anneal area which has a line shape extending alongside the third anneal area, and a second stitching area in which the third and fourth anneal areas at least partially overlap.

15. The reflective photomask of claim 11, wherein the black border area further includes a second stitching area in which the first and third anneal areas at least partially overlap.

16. The reflective photomask of claim 11, wherein the reflector layer includes a low-refractive index layer, and a high-refractive index layer having a higher refractive index than the low-refractive index layer, and wherein the low-refractive index layer and the high-refractive index layer are alternately stacked on the mask substrate.

17. A method for fabricating a reflective photomask which includes a pattern area and a black border area surrounding the pattern area, the method comprising:

sequentially forming a reflector layer and an absorber layer on a mask substrate;

performing a first annealing process at an edge of the black border area, in a step manner; and performing a second annealing process on an inside of the black border area, in a scan manner.

18. The method for fabricating a reflective photomask of claim 17, wherein the reflector layer includes a low-refractive index layer, and a high-refractive index layer having a higher refractive index than the low-refractive index layer, and wherein the low-refractive index layer and the high-refractive index layer are alternately stacked on the mask substrate.

19. The method for fabricating a reflective photomask of claim 17, wherein the absorber layer includes an opening that exposes at least a part of the reflector layer of the pattern area.

20. The method for fabricating a reflective photomask of claim 17, wherein each of the first annealing process and the second annealing process includes a laser annealing treatment.

* * * * *